(12) United States Patent
Arlbrant

(10) Patent No.: US 12,041,433 B2
(45) Date of Patent: Jul. 16, 2024

(54) AUDIO CROSSTALK CANCELLATION AND STEREO WIDENING

(71) Applicant: QUALCOMM Incorporated, San Diego, CA (US)

(72) Inventor: Jesper Mattias Arlbrant, Ingolstadt (DE)

(73) Assignee: QUALCOMM Incorporated, San Diego, CA (US)

( * ) Notice: Subject to any disclaimer, the term of this patent is extended or adjusted under 35 U.S.C. 154(b) by 138 days.

(21) Appl. No.: 17/655,620

(22) Filed: Mar. 21, 2022

(65) Prior Publication Data

US 2023/0319474 A1 Oct. 5, 2023

(51) Int. Cl.
| | |
|---|---|
| H04R 5/04 | (2006.01) |
| H03G 3/30 | (2006.01) |
| H03G 5/16 | (2006.01) |
| H04R 3/14 | (2006.01) |
| H04R 5/02 | (2006.01) |

(52) U.S. Cl.
CPC ............. *H04R 5/04* (2013.01); *H03G 3/3089* (2013.01); *H03G 5/165* (2013.01); *H04R 3/14* (2013.01); *H04R 5/02* (2013.01)

(58) Field of Classification Search
CPC ... H04R 5/04; H04R 3/14; H04R 5/02; H03G 3/3089; H03G 5/165
USPC ................................................ 381/1, 17–23
See application file for complete search history.

(56) References Cited

U.S. PATENT DOCUMENTS

| | | | | |
|---|---|---|---|---|
| 8,213,648 B2* | 7/2012 | Kimijima | ................ | H04S 5/005 |
| | | | | 381/310 |
| 9,351,073 B1* | 5/2016 | Alexandrov | ............ | H04S 7/303 |
| 2005/0265558 A1* | 12/2005 | Neoran | ................... | H04S 1/002 |
| | | | | 381/63 |
| 2008/0273721 A1* | 11/2008 | Walsh | ........................ | H04S 5/00 |
| | | | | 381/300 |
| 2009/0262947 A1* | 10/2009 | Karlsson | .................. | H04S 7/30 |
| | | | | 381/17 |

(Continued)

FOREIGN PATENT DOCUMENTS

| | | |
|---|---|---|
| WO | 2007066378 A1 | 6/2007 |
| WO | 2020125940 A1 | 6/2020 |

OTHER PUBLICATIONS

International Search Report and Written Opinion—PCT/US2023/064518—ISA/EPO—Jun. 30, 2023.

(Continued)

*Primary Examiner* — Xu Mei
(74) *Attorney, Agent, or Firm* — QUALCOMM Incorporated; Espartaco Diaz Hidalgo

(57) ABSTRACT

A device includes one or more processors configured to perform a first boost operation on a left audio signal to generate a boosted left audio signal, perform a second boost operation on a right audio signal to generate a boosted right audio signal, and perform a crosstalk cancellation operation that includes generation of an adjusted left audio signal and an adjusted right audio signal. The one or more processors are also configured to provide a left output signal for playback at a first speaker, the left output signal based at least in part on the adjusted left audio signal, and to provide a right output signal for playback at a second speaker, the right output signal based at least in part on the adjusted right audio signal.

20 Claims, 12 Drawing Sheets

(56) References Cited

U.S. PATENT DOCUMENTS

| | | | | |
|---|---|---|---|---|
| 2011/0038485 A1* | 2/2011 | Neoran | ............... | H04S 5/00 |
| | | | | 381/27 |
| 2011/0268281 A1* | 11/2011 | Florencio | ............ | H04S 7/302 |
| | | | | 381/26 |
| 2019/0090061 A1* | 3/2019 | Seldess | ............... | H04R 5/04 |

OTHER PUBLICATIONS

Takeuchi T., et al., "Optimal Source Distribution for Binaural Synthesis over Loudspeakersa)", The Journal of the Acoustical Society of America, American Institute of Physics, 2 Huntington Quadrangle, Melville, NY 11747, vol. 112, No. 6, Dec. 1, 2002, pp. 2786-2797, XP012003181, ISSN: 0001-4966, DOI: 10.1121/1.1513363, The Whole Document.

* cited by examiner

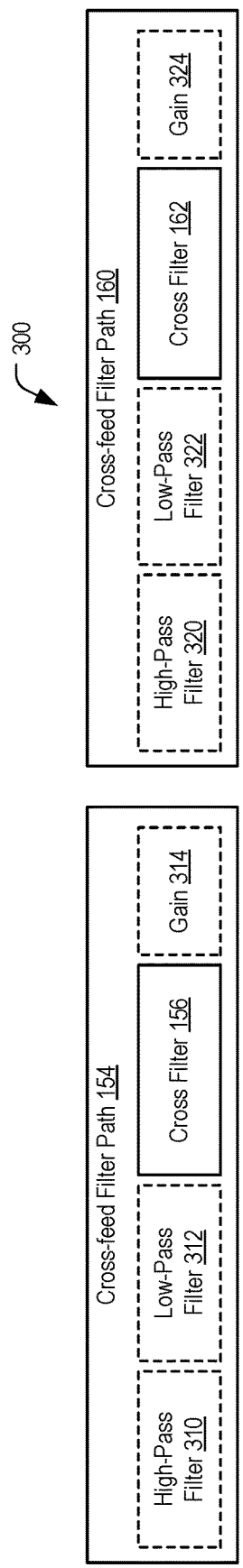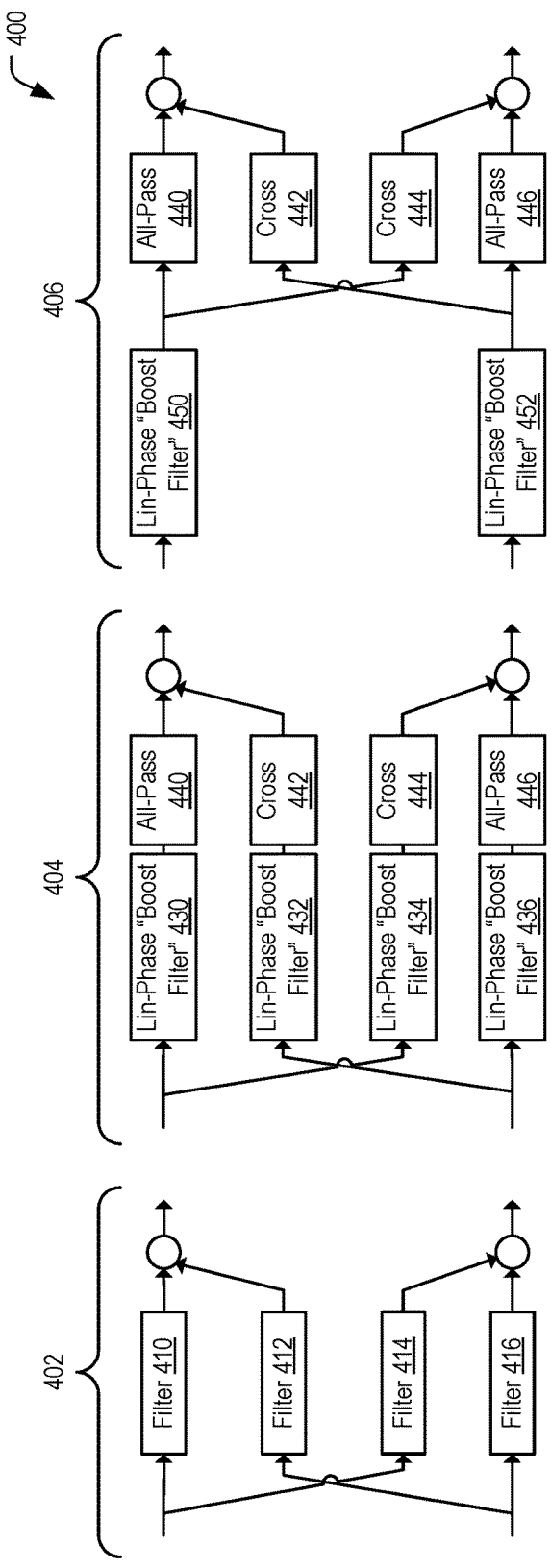
FIG. 3
FIG. 4

AUDIO CROSSTALK CANCELLATION AND STEREO WIDENING

I. FIELD

The present disclosure is generally related to processing audio data to reduce crosstalk and enhance stereo widening.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Stereo widening algorithms can be used to make sound from smart phone loudspeakers appear as if the sound originates from sources beyond the physical dimensions of the smart phone, creating a wide sound stage. Stereo widening can be performed using crosstalk cancellation that cancels acoustical cross-feed (e.g., from a left speaker to a listener's right ear, and from a right speaker to the listener's left ear) so that, ideally, the left ear only hears sound from the left speaker, and the right ear only hears sound from the right speaker. As a result, the listener perceives the sound as coming from invisible sources to the left and right, away from the loudspeakers' actual locations. Human hearing uses inter-aural level differences as an important cue to localize sounds, and stereo-widening algorithms exploit this aspect by amplifying the inter-aural level differences using controlled crosstalk cancellation.

Conventionally, crosstalk cancellation applies a 2×2 filter matrix to a stereo signal to generate an output stereo signal. The filter matrix is created by measuring a 2×2 transfer matrix, which includes performing individual measurements from each loudspeaker to each ear, and then inverting the transfer matrix to form an inverse-filter matrix.

However, conventional stereo wideners based on crosstalk cancellation and loudspeaker measurements may exhibit one or more characteristics that impact a listener's experience. For example, conventional stereo widening may introduce spectral coloration, weakened bass and center-panned sounds, and time-smeared transients, and bypassing the stereo widening may change the character of the sound. From a design perspective, a tuning process may be disrupted as a result of aspects being changed other than the stereo image during the tuning process, the measurement process may be time consuming and error-prone, and a designer may have no control over how available headroom is used, such as not being able to control how much gain is used for loudspeaker inversion, crosstalk cancellation, and spectral flattening, respectively. In traditional crosstalk cancellation, lower filter gain can only be obtained by using regularization, which degrades crosstalk cancellation performance. Thus, an improved stereo widening technique using improved crosstalk cancellation can result in an improved a listening experience, reduced complexity associated with designing stereo widening systems, or both.

III. SUMMARY

According to a particular implementation of the techniques disclosed herein, a device includes a memory configured to store instructions. The device also includes one or more processors configured to execute the instructions to perform a first boost operation on a left audio signal to generate a boosted left audio signal and perform a second boost operation on a right audio signal to generate a boosted right audio signal. The one or more processors are configured to execute the instructions to perform a crosstalk cancellation operation that includes generation of an adjusted left audio signal based at least in part on the boosted left audio signal and the boosted right audio signal and generation of an adjusted right audio signal based at least in part on the boosted left audio signal and the boosted right audio signal. The one or more processors are also configured to execute the instructions to provide a left output signal for playback at a first speaker, the left output signal based at least in part on the adjusted left audio signal, and to provide a right output signal for playback at a second speaker, the right output signal based at least in part on the adjusted right audio signal.

According to a particular implementation of the techniques disclosed herein, a method includes performing, at one or more processors, a first boost operation on a left audio signal to generate a boosted left audio signal. The method includes performing, at the one or more processors, a second boost operation on a right audio signal to generate a boosted right audio signal. The method also includes performing, at the one or more processors, a crosstalk cancellation operation. The crosstalk cancellation operation includes generating an adjusted left audio signal based at least in part on the boosted left audio signal and the boosted right audio signal, and generating an adjusted right audio signal based at least in part on the boosted left audio signal and the boosted right audio signal. The method further includes providing a left output signal to a first speaker for playback, the left output signal based at least in part on the adjusted left audio signal, and providing a right output signal to a second speaker for playback, the right output signal based at least in part on the adjusted right audio signal.

According to a particular implementation of the techniques disclosed herein, a non-transitory computer-readable medium includes instructions that, when executed by one or more processors, cause the one or more processors to perform a first boost operation on a left audio signal to generate a boosted left audio signal and to perform a second boost operation on a right audio signal to generate a boosted right audio signal. The instructions, when executed by the one or more processors, cause the one or more processors to perform a crosstalk cancellation operation that includes generation of an adjusted left audio signal based at least in part on the boosted left audio signal and the boosted right audio signal and generation of an adjusted right audio signal based at least in part on the boosted left audio signal and the boosted right audio signal. The instructions, when executed by the one or more processors, cause the one or more processors to provide a left output signal for playback at a first speaker, the left output signal based at least in part on the adjusted left audio signal, and to provide a right output signal for playback at a second speaker, the right output signal based at least in part on the adjusted right audio signal.

IV. BRIEF DESCRIPTION OF THE DRAWINGS

FIG. 3 is a diagram illustrating components of cross-feed filter paths that can be implemented in the system of FIG. 1, in accordance with some examples of the present disclosure.

FIG. 4 is a diagram illustrating decomposition and removal of a boost filter component from a conventional crosstalk cancellation filter configuration, in accordance with some examples of the present disclosure.

V. DETAILED DESCRIPTION

Figure 1:
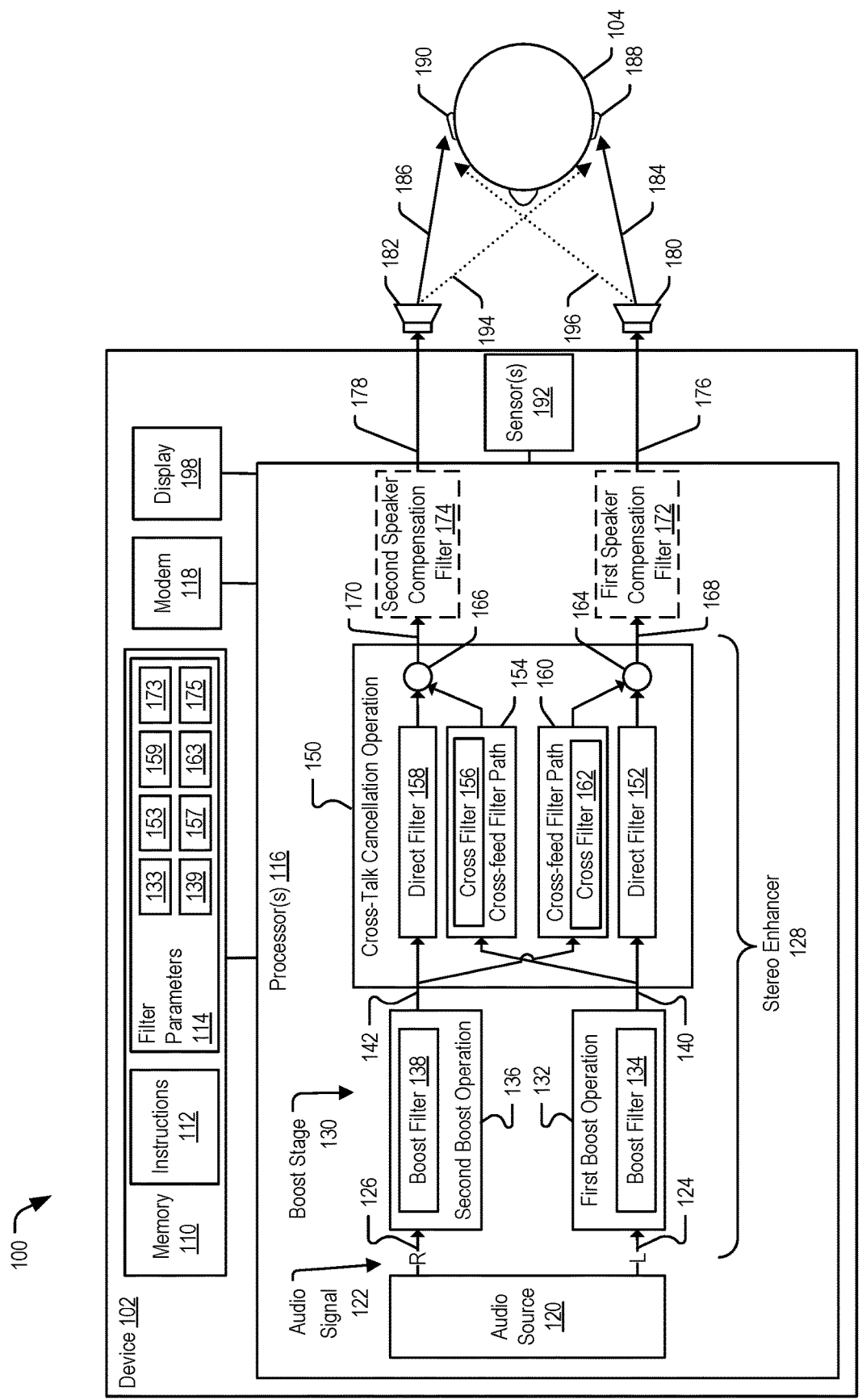
FIG. 1 is a block diagram illustrating an example of an implementation of a system operable to perform audio crosstalk cancellation that may be used for stereo widening, in accordance with some examples of the present disclosure.

Systems and methods to perform audio crosstalk cancellation and stereo widening techniques are disclosed. Conventional stereo widening using crosstalk cancellation can exhibit drawbacks such as spectral coloration, weakened bass and center-panned sounds, time-smeared transients, and changing sound character when bypassing the stereo widening. Other drawbacks can include disruptions to the tuning process, a time consuming, complicated, and error-prone measurement process, and lack of control of how available headroom is used, such as how much gain is used for loudspeaker inversion, crosstalk cancellation, and spectral flattening, respectively. In traditional crosstalk cancellation, lower filter gain can only be obtained by using regularization, which degrades crosstalk cancellation performance. The disclosed systems and methods for crosstalk cancellation for stereo widening incorporate techniques that enable many, if not all, of these drawbacks to be reduced or eliminated, thus providing an improved experience for the listener and reduced complications during system design.

According to some aspects, a simplified parametric model of the transfer functions to be inverted is used. For example, to determine a crosstalk cancellation system for loudspeakers (e.g. micro-speakers) on a phone, a spherical head model is used to create a synthetic transfer matrix and can use the distance to the phone and the separation of the loudspeakers as parameters. The synthetic transfer matrix is then inverted to form a starting point for design of a crosstalk cancellation matrix and boost filter.

According to some aspects, a separation of traditional crosstalk cancellation filters into speaker correction filters (also referred to as speaker compensation filters) and a crosstalk cancellation filter matrix is performed. Since stereo imaging is affected by inter-loudspeaker differences, by handling differences between the loudspeakers separately from the crosstalk cancellation filter matrix, the stereo widener can function independent of the loudspeakers' transfer functions. The speaker correction filters make the loudspeakers' responses effectively equal to each other in the frequency-range of interest, which results in a symmetrical crosstalk cancellation matrix and removes inter-channel differences, decoupling loudspeaker inversion, correction, and equalization from crosstalk cancellation. As a result, the tuning process is simplified, and greater flexibility is provided.

According to some aspects, a decomposition of basic crosstalk cancellation filters into minimum-phase boost filters and a modified crosstalk cancellation (CTC) matrix is performed. The purpose of the boost filters is to flatten the response at the listener's ears by compensating for cancellation effects from the CTC matrix. The separate boost filters allow for a trade-off between filter boost (which consumes digital headroom in addition to increasing loudspeaker excursion) and perceived spectral flatness. In contrast to the conventional technique of using regularization to reduce filter gain, the disclosed boost filter approach does not affect crosstalk cancellation performance. In some implementations, an adaptive boost is generated by varying the amount of cross-feed and boost-filter strength dynamically during runtime, depending on the envelope of the digital signal, estimated loudspeaker excursion, or both.

According to some aspects, the cross-feed filters of the CTC matrix are band-constrained. To illustrate, a lower frequency limit can be applied, such as to control the amount of additional low-frequency energy that is fed to microspeakers. In an example, the crosstalk cancellation can be constrained to the frequency band above the loudspeakers' resonance frequency to avoid stressing the speaker drivers. An upper frequency limit can be applied to limit the crosstalk cancellation to a frequency band where it is spatially robust—e.g., where minor head movements of the listener do not affect the perceived stereo widening effect.

According to some aspects, a Left-Center-Right (LCR) decomposition is performed in a pre-processing stage before the crosstalk cancellation stage. The LCR decomposition separates the input stereo signal into a C (center) channel that is common to both stereo channels and that can contain voices and bass, which are commonly center-panned, a L (left) channel, and a R (right) channel. Ideally, the decomposition L and R channels contain only what is unique to the left and the right stereo channels, respectively. After the LCR decomposition, only the decomposition L and R channels are fed to the CTC matrix. A delay-compensated version of the C channel is added back to the CTC output, and the result is fed to the loudspeaker correction filters to form the final loudspeaker output signals. Various LCR decomposition techniques may be used. For example, in some implementations, the LCR components are generated using sum and difference operations on the stereo channels. In other implementations, a frequency-domain decomposition technique is used that can provide improved performance as compared to using sum and difference operations. Because mono/center-panned components are unaffected by (e.g., bypass) the crosstalk cancellation operation and instead only actual stereo components, such as side-panned sounds or reverberation, are widened, and also because of the band-limiting of the cross-feed filter, the stereo-widener may be effectively transparent to bass, mono signals, and center-panned sources like voices.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

As used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive signals (e.g., digital signals or analog signals) directly or indirectly, via one or more wires, buses, networks, etc. As used herein, "directly coupled" may include two devices that are coupled (e.g., communicatively coupled, electrically coupled, or physically coupled) without intervening components.

In the present disclosure, terms such as "determining," "calculating," "estimating," "shifting," "adjusting," etc. may be used to describe how one or more operations are performed. It should be noted that such terms are not to be construed as limiting and other techniques may be utilized to perform similar operations. Additionally, as referred to herein, "generating," "calculating," "estimating," "using," "selecting," "accessing," and "determining" may be used interchangeably. For example, "generating," "calculating," "estimating," or "determining" a parameter (or a signal) may refer to actively generating, estimating, calculating, or determining the parameter (or the signal) or may refer to using, selecting, or accessing the parameter (or signal) that is already generated, such as by another component or device.

Referring to FIG. 1, a particular illustrative aspect of a system 100 is depicted that includes a device 102 that is configured to perform audio crosstalk cancellation for stereo widening. The device 102 includes a memory 110 coupled to one or more processors 116 and configured to store instructions 112. The one or more processors 116 are configured to execute the instructions 112 to perform operations associated with processing audio for playback to a user 104. For example, the one or more processors 116 are configured to perform stereo widening operations associated with a stereo enhancer 128, including a boost stage 130 and a crosstalk cancellation operation 150, so that sound played out by a first speaker 180 and a second speaker 182 is perceived by the user 104 to originate from a wider sound source than the distance between the speakers 180 and 182. In an illustrative example, the device 102 corresponds to a portable electronic device, such as a laptop computer, a tablet computer, or a smart phone, and the distance between the speakers 180 and 182 is relatively small (e.g., a few inches).

The memory 110 stores the instructions 112 and also stores filter parameters 114 associated with filters used by the one or more processors 116, as described in further detail below. The filter parameters 114 include filter parameters 133 (e.g., one or more filter coefficients) for a first boost filter 134, filter parameters 139 for a second boost filter 138, first filter coefficients 153 for a first direct filter 152, second filter coefficients 159 for a second direct filter 158, third filter coefficients 157 for a first cross filter 156, fourth filter coefficients 163 for a second cross filter 162, filter parameters 173 for a first speaker compensation filter 172, and filter parameters 175 for a second speaker compensation filter 174. Some or all of the filter parameters 114 may be static parameters that are determined offline, such as during a calibration process. In some implementations, some of the filter parameters 114 may be dynamically determined, set based on a user selection, or a combination thereof.

The one or more processors 116 are configured to obtain an audio signal 122 from an audio source 120. For example, the audio source 120 may correspond to a portion of one or more of media files (e.g., retrieved from the memory 110), a game engine, one or more other sources of sound information, such as a remote media server, or a combination thereof. In a particular implementation, the audio signal 122 corresponds to a stereo signal that includes a left audio signal (L) 124 and a right audio signal (R) 126.

In the boost stage 130, the one or more processors 116 are configured to perform a first boost operation 132 on the left audio signal 124 to generate a boosted left audio signal 140 and to perform a second boost operation 136 on the right audio signal 126 to generate a boosted right audio signal 142. In a particular implementation, each of the first boost operation 132 and the second boost operation 136 corresponds to a frequency-dependent linear filtering operation. For example, the first boost operation 132 includes processing the left audio signal 124 using the first boost filter 134 to generate the boosted left audio signal 140, and the second boost operation 136 includes processing the right audio signal 126 using the second boost filter 138 to generate the boosted right audio signal 142. Additional description regarding the first boost filter 134 and the second boost filter 138 is provided with reference to FIG. 4.

The crosstalk cancellation operation 150 includes generation of an adjusted left audio signal 168 based at least in part on the boosted left audio signal 140 and the boosted right audio signal 142. The crosstalk cancellation operation 150 also includes generation of an adjusted right audio signal 170 based at least in part on the boosted left audio signal 140 and the boosted right audio signal 142. To illustrate, the one or more processors 116 provide the boosted left audio signal 140 as an input to the first direct filter 152 and as an input to a first cross-feed filter path 154 that includes the first cross filter 156. The one or more processors 116 also provide the boosted right audio signal 142 as an input to the second direct filter 158 and as an input to a second cross-feed filter path 160 that includes the second cross filter 162.

The first cross filter 156 and the second cross filter 162 are configured to at least partially cancel crosstalk that would otherwise be perceived by the user 104 during playback. As illustrated, sound received at the left ear 188 of the user 104 includes a component 184 from the first speaker 180 and also includes a component 194 from the second speaker 182. Sound received at the right ear 190 of the user 104 includes a component 186 from the second speaker 182 and a component 196 from the first speaker 180.

The second cross filter 162 provides an output to a first combiner 164, based on the boosted right audio signal 142, that combines with an output of the first direct filter 152 to cancel (or substantially cancel) the component 194 from the second speaker 182 received at the left ear 188. Similarly, the first cross filter 156 provides an output to a combiner 166, based on the boosted left audio signal 140, that combines with an output of the second direct filter 158 to cancel (or substantially cancel) the component 196 from the first speaker 180 received at the right ear 190. Thus, the one or more processors 116 generate the adjusted left audio signal 168 based at least in part on an output of the first direct filter 152 and an output of the second cross filter 162 and generate the adjusted right audio signal 170 based at least in part on an output of the second direct filter 158 and an output of the first cross filter 156.

The one or more processors 116 are configured to provide a left output signal 176 for playback at the first speaker 180 and a right output signal 178 for playback at the second speaker 182. The left output signal 176 is based at least in part on the adjusted left audio signal 168, and the right output signal 178 is based at least in part on the adjusted right audio signal 170. For example, in some implementations in which the speaker response of the first speaker 180 matches the speaker response of the second speaker 182, the left output signal 176 may match the adjusted left audio signal 168, and the right output signal 178 may match the adjusted right audio signal 170.

In other implementations in which the speaker response of the first speaker 180 does not substantially match the speaker response of the second speaker 182, a set of filters may be used to compensate differences between the respective speaker responses. To illustrate, the adjusted left audio signal 168 is provided to a first speaker compensation filter 172, and the adjusted right audio signal 170 is provided to a second speaker compensation filter 174. (Dashed boxes are used to indicate that the first speaker compensation filter 172 and the second speaker compensation filter 174 may be optional components.) The first speaker compensation filter 172 is configured to perform a first equalization operation on the adjusted left audio signal 168 to adjust a first speaker response of the first speaker 180, and the second speaker compensation filter 174 is configured to perform a second equalization operation on the adjusted right audio signal 170 to adjust a second speaker response of the second speaker 182. To illustrate, the filter parameters 173 for the first speaker compensation filter 172 and the filter parameters 175 for the second speaker compensation filter 174 are based on the inter-speaker differences between the first speaker 180 and the second speaker 182. In an implementation in which the first speaker compensation filter 172 and the second speaker compensation filter 174 are included, and the speaker response of the first speaker 180 substantially matches the speaker response of the second speaker 182, the first speaker compensation filter 172 and the second speaker compensation filter 174 may be implemented as all-pass filters that provide no filtering modification (or only negligible filtering modification) to the incoming adjusted audio signals 168 and 170, respectively.

Because the responses of the first speaker 180 and the second speaker 182 substantially match, or are adjusted to substantially match via operation of the first speaker compensation filter 172 and the second speaker compensation filter 174, the filter parameters 114 that are associated with the crosstalk cancellation operation 150 are independent of inter-speaker differences between the first speaker 180 and the second speaker 182. As a result, in some implementations, a filter matrix associated with the crosstalk cancellation operation 150 is symmetric, with the first filter coefficients 153 associated with the first direct filter 152 matching the second filter coefficients 159 associated with the second direct filter 158, and with the third filter coefficients 157 associated with the first cross filter 156 matching the fourth filter coefficients 163 associated with the second cross filter 162.

The device 102 also includes a modem 118 coupled to the one or more processors 116 and configured to enable communication with one or more other devices, such as via one or more wireless networks. According to some aspects, the modem 118 is configured to receive the audio signal 122 (e.g., the left audio signal 124 and the right audio signal 126) from a second device, such as stereo data that is streamed from a remote server for playback at the device 102.

The device 102 includes a display device 198 (e.g., a display screen) coupled to the one or more processors and configured to provide a visual interface to the user 104. For example, the display device 198 may present video content associated with playback of the audio signal 122 (e.g., during playback of multimedia data), a graphical user interface, such as via a touchscreen, one or more other types of graphical, image, or video content, or a combination thereof. In some implementations, the display device 198 is configured to depict separate displays of the crosstalk cancellation filters (e.g., the first direct filter 152, the second direct filter 158, the first cross filter 156, and the second cross filter 162) and of the speaker compensation filters 172 and 174, such as described further with reference to FIG. 2. Although the device 102 is illustrated as including the display device 198, in other implementations the device 102 does not include the display device 198. For example, in some implementations the display device 198 can be an external display that is coupled to the device 102 (e.g., via wireless communication), while in other implementations the device 102 can be a dedicated audio playback device that does not support display functionality.

In some implementations, the device 102 includes one or more sensors 192 that enable detection of a distance between the device 102 and the user 104. For example, in a particular implementation the one or more sensors 192 include a proximity sensor, such as one or more optical (e.g., an imaging sensor or a laser rangefinder), radar, ultrasonic, or other types of proximity sensors, one or more other types of detector that can be used to detect distance, such as an infrared sensor or a stereo triangulation, time-of-flight, or structured light camera system, or any combination thereof. A detected distance between the device 102 and the user 104 can be used to adaptively change one or more filter parameters associated with the stereo enhancer 128, as described further with reference to FIG. 2. Although the device 102 is illustrated as including the one or more sensors 192 configured to detect the distance between the device 102 and the user 104, in other implementations the device 102 does not include the one or more sensors 192. In some implementations, the device 102 may include the one or more sensors 192 but may not be configured to use the detected distance to update filter parameters associated with the stereo enhancer 128.

During operation, the stereo enhancer 128 processes the audio signal 122 at the boost stage 130 via operation of the first boost filter 134 and the second boost filter 138. The resulting boosted left audio signal 140 and boosted right audio signal 142 are processed at the crosstalk cancellation operation 150 to generate the adjusted left audio signal 168 and the adjusted right audio signal 170, which are played out to the user 104 (after processing by the speaker compensation filters 172 and 174, if present) via the first speaker 180 and the second speaker 182, respectively. As a result, the component 184 of the sound received at the user's left ear 188 from the first speaker 180 substantially cancels the component 194 received at the left ear 188 from the second speaker 182, having the effect of making the user's left ear 188 only hear sound from the first speaker 180. In addition, the component 186 of the sound received at the right ear 190 from the second speaker 182 substantially cancels the component 196 received at the right ear 190 from the first speaker 180, having the effect of making the user's right ear 190 only hear sounds from the second speaker 182. The result is that the brain of the user 104 is tricked into perceiving the sound as coming from invisible sources to the left and right of the user 104, away from the actual locations of the speakers 180 and 182.

Figure 9:
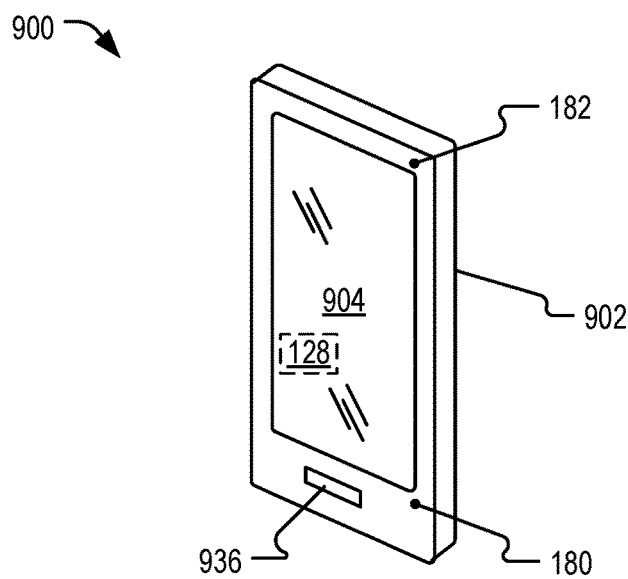
FIG. 9 is a diagram of an implementation of a portable electronic device operable to perform audio crosstalk cancellation that may be used for stereo widening, in accordance with some examples of the present disclosure.
Figure 10:
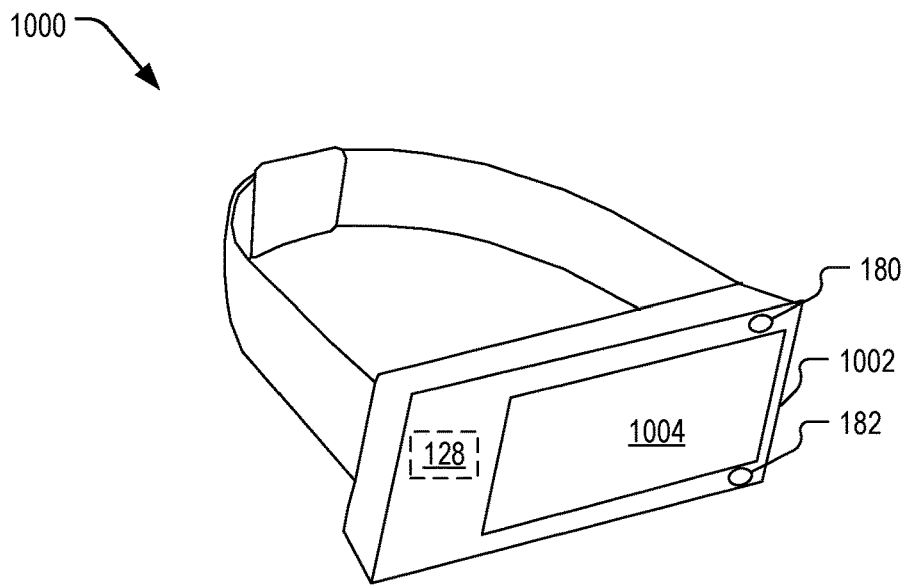
FIG. 10 is a diagram of a wearable electronic device operable to perform audio crosstalk cancellation that may be used for stereo widening, in accordance with some examples of the present disclosure.
Figure 11:
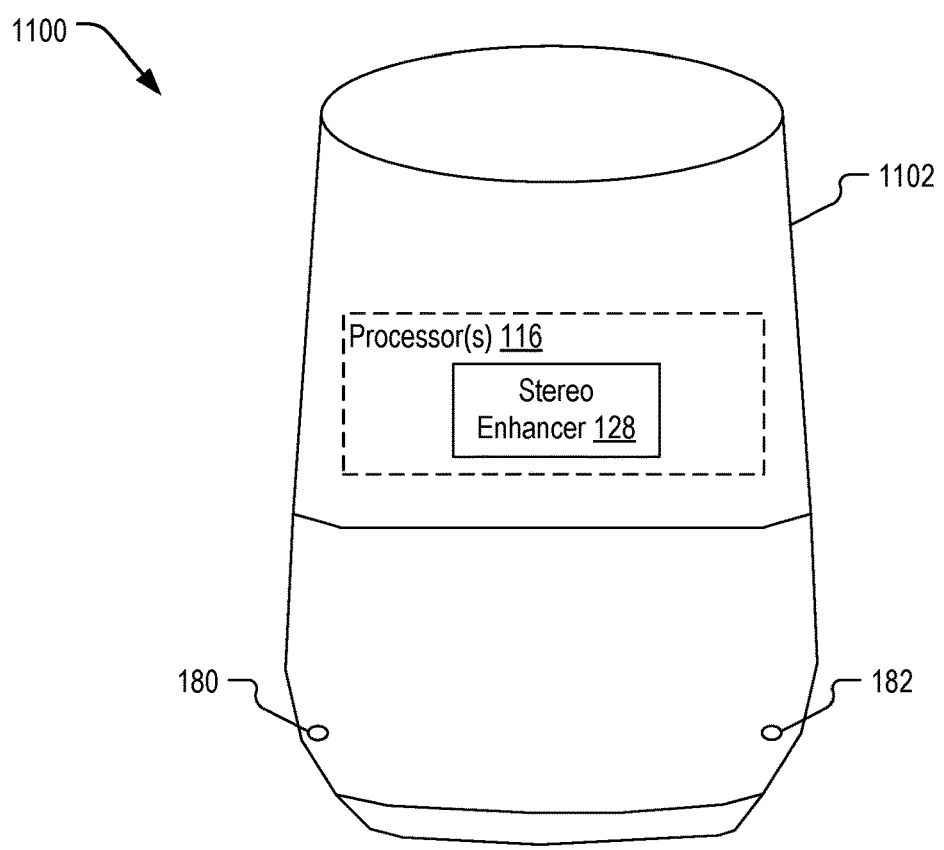
FIG. 11 is a diagram of a voice-controlled speaker system operable to perform audio crosstalk cancellation that may be used for stereo widening, in accordance with some examples of the present disclosure.
Figure 12:
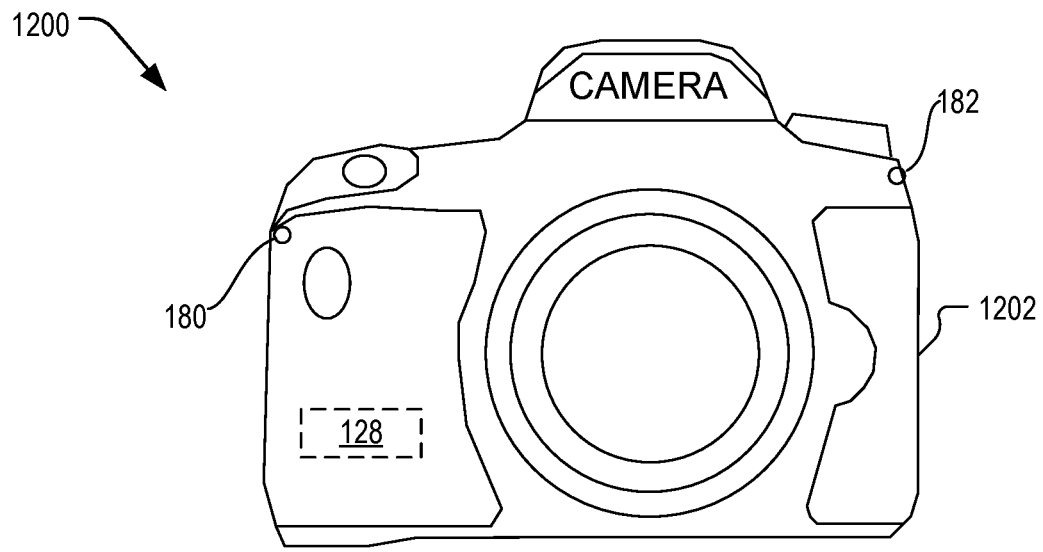
FIG. 12 is a diagram of a camera operable to perform audio crosstalk cancellation that may be used for stereo widening, in accordance with some examples of the present disclosure.
Figure 13:
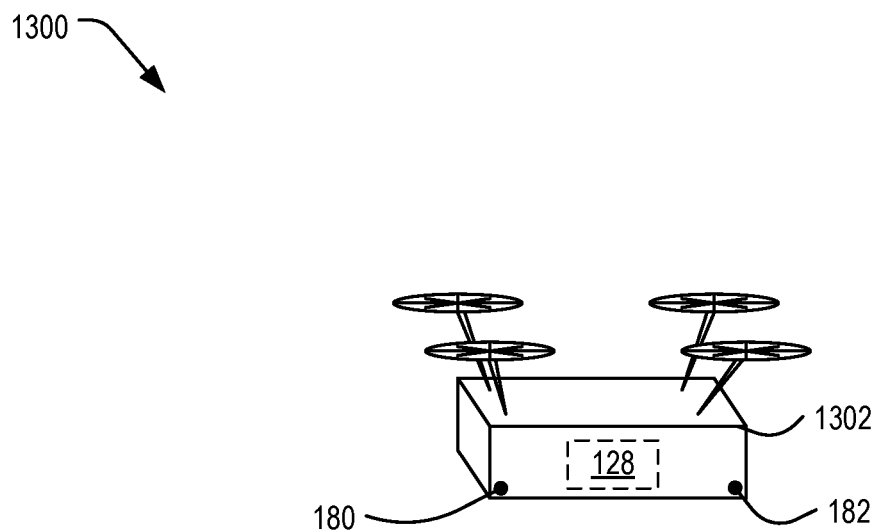
FIG. 13 is a diagram of a first example of a vehicle operable to perform audio crosstalk cancellation that may be used for stereo widening, in accordance with some examples of the present disclosure.
Figure 14:
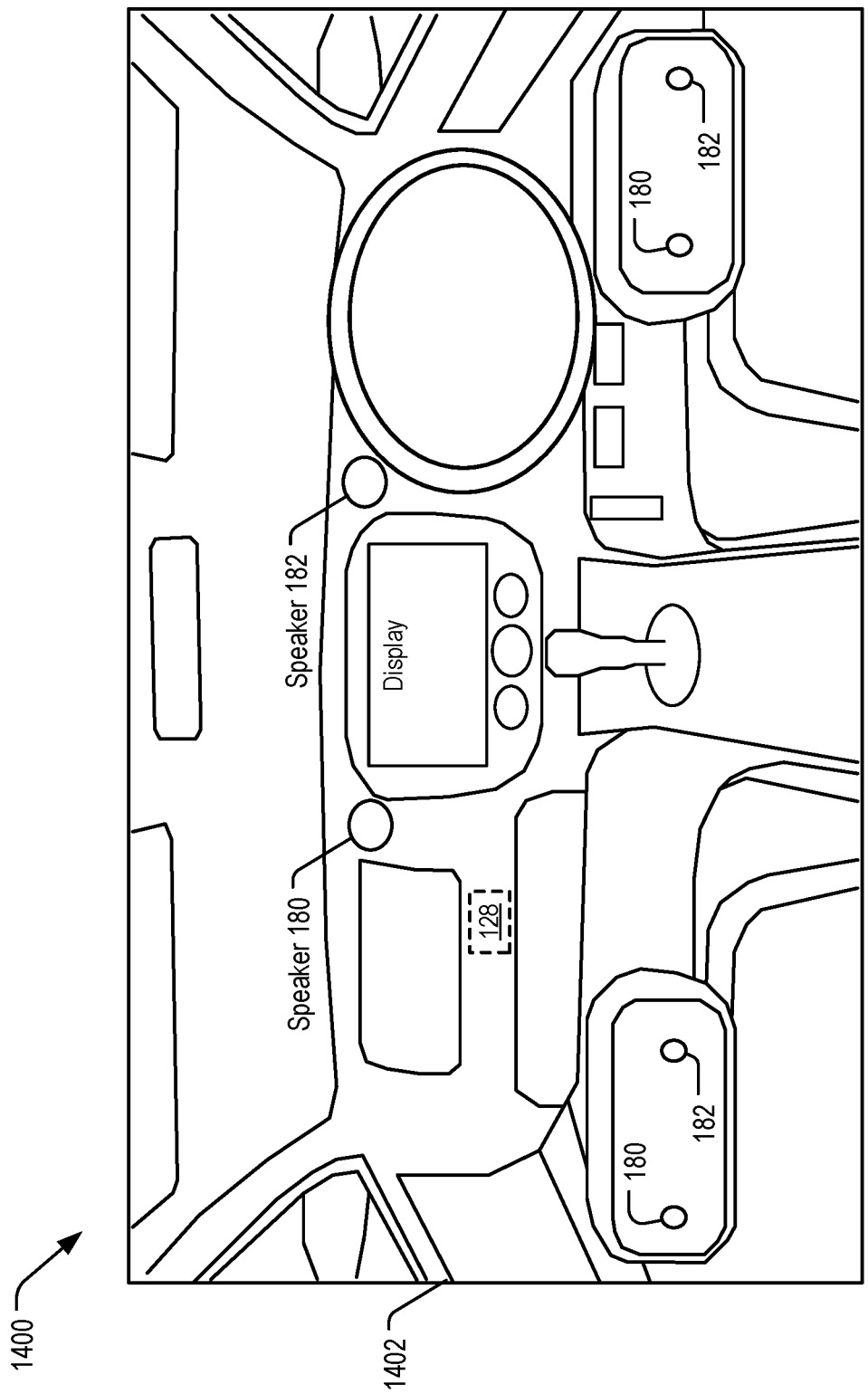
FIG. 14 is a diagram of a second example of a vehicle operable to perform audio crosstalk cancellation that may be used for stereo widening, in accordance with some examples of the present disclosure.

According to some aspects, the one or more processors 116 are integrated in at least one of a mobile phone or a tablet computer device, such as illustrated in FIG. 9. According to some aspects, the one or more processors 116 are integrated in a wearable electronic device as illustrated in FIG. 10, a voice-controlled speaker system as illustrated in FIG. 11, or a camera device as illustrated in FIG. 12. According to some aspects, the one or more processors 116 are integrated in a virtual reality headset, a mixed reality headset, or an augmented reality headset (e.g., a headset in which speakers are used that may otherwise generate crosstalk, such as speakers proximate to or integrated with a visual display), or a vehicle as illustrated in FIG. 13 and FIG. 14.

Although the first speaker 180 and the second speaker 182 are illustrated as included in (e.g., integrated with) the device 102, in other implementations, the first speaker 180, the second speaker 182, or both, are not included in the device 102. For example, according to some implementations, the first speaker 180 and the second speaker 182 are included in a sound bar or other external speaker configuration. Although the effects of stereo widening may be most pronounced in systems in which the distance between the speakers 180 and 182 is relatively small, such as speakers in a smart phone or wearable electronic device in which the separation of the speakers is limited by the dimensions of the housing of the smart phone or wearable device, the techniques described herein are not limited to such devices and may be used in systems of any size, such as in a vehicle or home entertainment system, as illustrative, non-limiting examples.

Although the stereo enhancer 128 of FIG. 1 is described as processing 2-channel stereo input for playback over two loudspeakers, in other implementations the techniques described herein can be used in configurations with more than two loudspeakers, as will be understood by one of skill in the art. For example, in some implementations, the left output signal 176 is provided to a first set of multiple speakers including the first speaker 180, and the right output signal 178 is provided to a second set of multiple speakers including the second speaker 182. In a particular implementation, if the speakers in the first set of multiple speakers do not have matching speaker responses, or if the speakers in the second set of multiple speakers do not have matching speaker responses, one or more additional speaker compensation filters may be added to compensate for differences in the responses of the individual speakers.

In another example, the first speaker 180 may be replaced with (or included in) a first speaker system that includes a first crossover device configured to output multiple frequency bands to a first set of multiple speakers (e.g., a first "tweeter" and a first "woofer"), the second speaker 182 may be replaced with (or included in) a second speaker system that includes a second crossover device configured to output multiple frequency bands to a second set of multiple speakers (e.g., a second tweeter and a second woofer), or a combination thereof. The speaker compensation filters 172 and 174 may be configured to compensate differences between the response of the first speaker system and the response of the second speaker system.

In another example in which 4-channel input is processed for playback at four speakers, the crosstalk cancellation operation 150 can include additional cross-feed filter paths to enable cancelation or partial cancellation, at the output of one speaker, of the sound components from the other three speakers. To illustrate, the combiner 166 may be configured to combine the output of the direct filter 158, the output of the cross-feed filter path 154, the output of a third cross-feed filter path for a third audio channel, and the output of a fourth cross-feed filter path for a fourth audio channel, to cancel components from the first speaker 180, a third speaker, and a fourth speaker from being heard at the right ear 190 of the user 104. Selection of a crosstalk cancellation filter matrix corresponding to the crosstalk cancellation operation 150 may be performed as an extension of the two-speaker configuration described with reference to FIG. 2.

Figure 2:
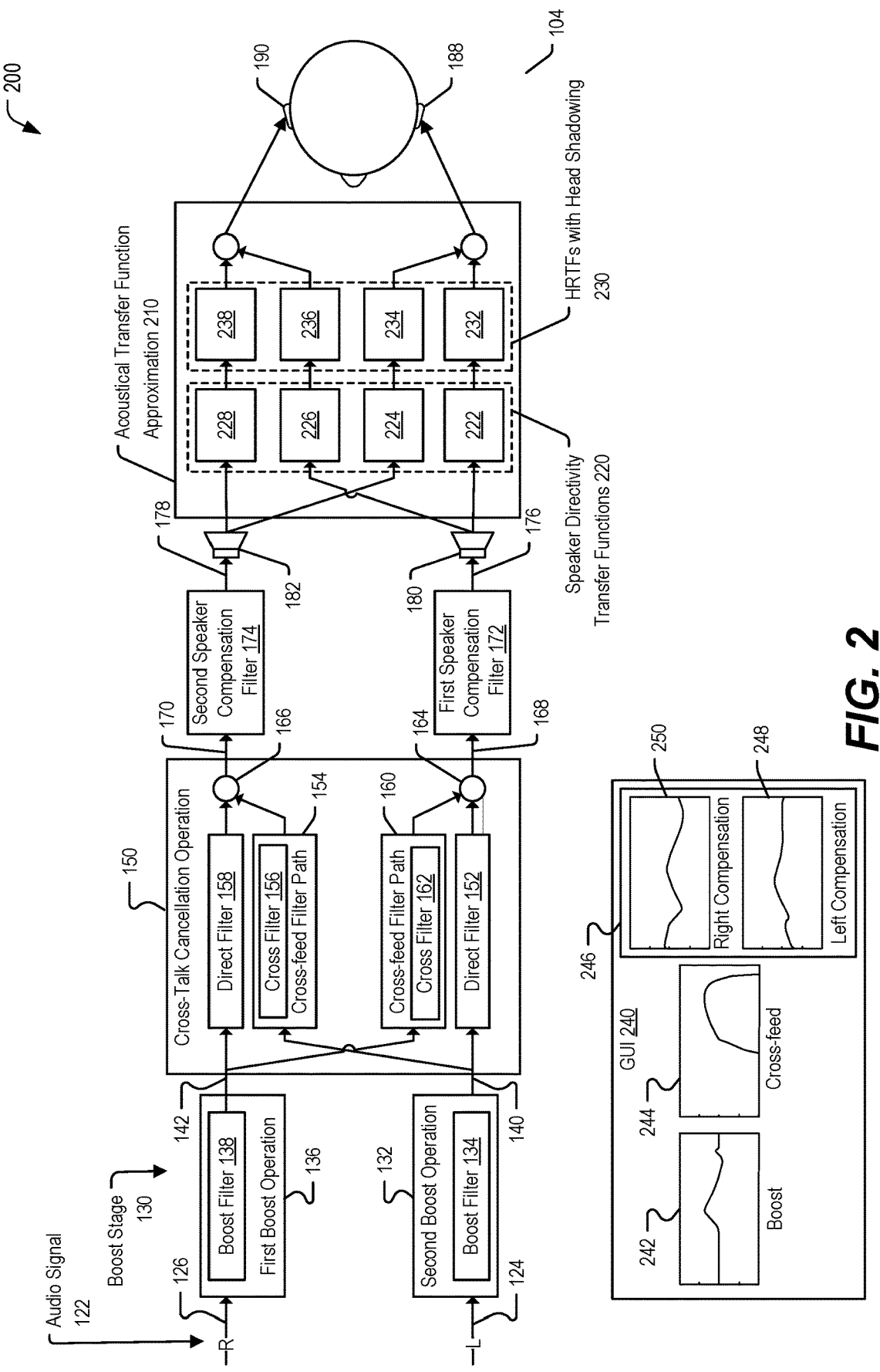
FIG. 2 is a block diagram illustrating a particular implementation of components that may be used in the system of FIG. 1 and illustrating an acoustical transfer function approximation, in accordance with some examples of the present disclosure.

FIG. 2 depicts a particular implementation of a system 200 that includes components that may be used in the system of FIG. 1 and also includes an acoustical transfer function approximation 210 and an illustrative graphical user interface 240. As illustrated, the components include the first boost filter 134 and the second boost filter 138 of the boost stage 130, the first direct filter 152, the second direct filter 158, the first cross-feed filter path 154, the second cross-feed filter path 160, the first combiner 164, and the second combiner 166 of the crosstalk cancellation operation 150, the first speaker compensation filter 172, the second speaker compensation filter 174, the first speaker 180, and the second speaker 182 of FIG. 1.

The acoustical transfer function approximation 210 includes a set of speaker directivity transfer functions 220 and a set of head response transfer functions (HRTFs) 230 with head shadowing. The speaker directivity transfer functions 220 include a transfer function 222 for the sound propagation path from the first speaker 180 to the left ear 188, a transfer function 224 for the sound propagation path from the second speaker 182 to the left ear 188, a transfer function 226 for the sound propagation path from the first speaker 180 to the right ear 190, and a transfer function 228 for the sound propagation path from the second speaker 182 to the right ear 190. Although in some implementations the directional properties of the first speaker 180 and the second speaker 182 can be represented in the speaker directivity transfer functions 220, in other implementations complexity is reduced using the simplifying assumption that the first speaker 180 and the second speaker 182 exhibit uniform directivity.

The HRTFs 230 include a transfer function 232 corresponding to the path from the first speaker 180 to the left ear 188, a transfer function 234 corresponding to the path from the second speaker 182 to the left ear 188, a transfer function 236 corresponding to the path from the first speaker 180 to the right ear 190, and a transfer function 238 corresponding to the path from the second speaker 182 to the right ear 190. In some implementations, the HRTFs 230 are determined using one or more complexity-reducing simplifications, such as HRTFs that use of a spherical head model, independent of speakers, independent of fine HRTF details, dependent on geometry, and based a plane wave assumption.

The crosstalk cancellation filters (e.g., the first direct filter 152, the second direct filter 158, the first cross filter 156, and the second cross filter 162) are determined via inversion of the acoustical transfer function approximation 210. Because the first speaker compensation filter 172 and the second speaker compensation filter 174 compensate for differences between the speaker responses of the first speaker 180 and the second speaker 182, resulting in effective speaker responses that are approximately equal, the speaker responses can be excluded from the crosstalk filter design and can be effectively ignored (from a linear perspective).

According to an aspect, as a result of the first speaker compensation filter 172 and the second speaker compensation filter 174 compensating differences between the speakers 180 and 182, the filter parameters for the first direct filter 152, the second direct filter 158, the first cross filter 156, and the second cross filter 162 are determined independently of the speakers 180 and 182, since only inter-channel differences matter for stereo. The resulting crosstalk correction filter matrix is symmetrical. According to an aspect, all equalization for the audio output can be performed using stereo equalization techniques without requiring separate equalization associated with the crosstalk cancellation operation 150, significantly reducing complexity as compared to conventional techniques in which the speaker compensation filters 172 and 174 are omitted and the speaker response differences are manifested in a non-symmetric crosstalk filter matrix. As a result, the potential of degrading the stereo image as a result of asymmetrical equalization is reduced or eliminated.

Further, the use of the first speaker compensation filter 172 and the second speaker compensation filter 174 results in the adjusted left audio signal 168 and the adjusted right audio signal 170 being determinative of speaker excursion and amplitude, which are therefore controllable based on the boost filters 134 and 138 and based on gains applied in the cross-feed filter paths 154 and 160 (which match each other due to the symmetry of the crosstalk cancellation filter matrix). Thus, speaker excursion is more easily controlled as compared to conventional systems in which the boost filters 134 and 138 and the speaker compensation filters 172 and 174 are omitted and the crosstalk cancellation filter matrix is non-symmetrical.

In some implementations, one or more of the cross-talk cancellation filters can be adjusted based on detecting a change of distance between the device 102 and the user 104 of FIG. 1, such as a distance from the midpoint between the speakers 180 and 182 and the face or head of the user 104. For example, multiple instances of the acoustical transfer function approximation 210 may be generated for multiple predetermined distances between the user 104 and the device 102, resulting in differences in the speaker directivity transfer functions 220, the HRTFs 230, or both. The multiple instances of the acoustical transfer function approximation 210 can be generated offline and used to generate multiple sets of filter parameters of the cross filters 156 and 162, which can be stored at the memory 110 and selected, during audio playback, by the one or more processors 116 based on a detected distance between the device 102 and the user 104 via the one or more sensors 192. In some implementations, multiple sets of the filter parameters corresponding to the direct filters 152 and 158, the boost filters 134 and 138, or both, are also generated based on multiple instances of the acoustical transfer function approximation 210, stored at the memory 110, and selected by the one or more processors 116 in conjunction with selecting the filter parameters of the cross filters 156 and 162. One or more other stereo-widener parameters that include distance between loudspeakers and distance to the user's head may also be updated.

In some examples, each of the multiple sets of filter parameters corresponds to a respective range of distances to the user 104 (e.g., a first set for distances under 0.5 meters (m), a second set for distances from 0.5 m to 1 m, and a third set for distances over 1 m), and the one or more processors 116 selects and uses the stored set of filter parameters whose corresponding range encompasses the distance to the user 104. In other examples, each of the multiple stored sets of filter parameters corresponds to a respective specific distance (e.g., 0.5 m, 1 m, and 1.5 m), and the one or more processors 116 generate filter parameters based on two or more of the stored sets, such as by performing linear interpolation or another interpolation technique for a user located between two of the specified distances. Although in the above examples the sets of filter parameters may be generated during an offline tuning operation, in other examples the one or more processors 116 may compute the filter parameters on-the-fly (e.g., in real-time) during audio playback by determining the acoustical transfer function approximation based on the current detected distance to the user 104 and determining the filter parameters via inversion of the acoustical transfer function approximation 210. The above-described examples may therefore illustrate a tradeoff between cross-feed cancellation accuracy and an amount of processor resources associated with achieving such accuracy during audio playback.

In some implementations, a representation of one or more filters are displayed to the user 104, such as via the display device 198. The graphical user interface (GUI) 240 depicts an example in which a first display element 242 represents a frequency response of the boost filters 134 and 138, a second display element 244 represents a frequency response of the cross-talk cancellation filters, and a third display element 246 represents a frequency response of the speaker compensation filters 172 and 174. As illustrated, a single frequency response is depicted for the boost filters 134 and 138, and a single frequency response is depicted for the cross-talk cancellation filters (e.g., the cross feed filter paths 154 and 160, as described further in FIG. 3 and FIG. 4), due to symmetry arising from independence from inter-speaker differences. The third display element 246 includes a first frequency response 248 for the first speaker compensation filter 172 and a second frequency response 250 for the second speaker compensation filter 174 based on the inter-speaker differences between the first speaker 180 and the second speaker 182. According to some implementations, the GUI 240 enables user modification or selection of one or more filter responses for customizing a stereo widening effect via user input.

Although the GUI 240 is described as being displayed via the display device 198 of the device 102, in other implementations, the GUI 240 may be transmitted to another device, such as a server or another computing device (e.g., a laptop computer or tablet computer) for display. Although the GUI 240 is illustrated as including the first display element 242 representing the frequency response of the boost filters 134 and 138, the second display element 244 representing the frequency response of the cross-talk cancellation filters, and the third display element 246 representing the frequency response of the speaker compensation filters 172 and 174, in other implementations the GUI 240 omits one or more of the display elements 242-246. As an illustrative, non-limiting example, the GUI 240 may include the second display element 244 representing the frequency response of the cross-talk cancellation filters and the third display element 246 representing the frequency response of the speaker compensation filters 172 and 174, and may omit the first display element 242 representing the frequency response of the boost filters 134 and 138.

FIG. 3 depicts an example 300 of components that can be included in the cross-feed filter paths 154 and 160, with optional components indicated using dashed borders. As illustrated, the first cross-feed filter path 154 includes a first high-pass filter 310, a first low-pass filter 312, the first cross filter 156, and a first gain 314. The second cross-feed filter path 160 includes a second high-pass filter 320, a second low-pass filter 322, the second cross filter 162, and a second gain 324. According to an aspect, due to the symmetry of the crosstalk cancellation filter matrix, each of the components of the first cross-feed filter path 154 matches the corresponding component in the second cross-feed filter path 160.

During operation, the first cross-feed filter path 154 applies the first high-pass filter 310 to a received signal (e.g., the boosted left audio signal 140) and generates a high-pass filtered output. According to an aspect, the first high-pass filter 310 has a first cut-off frequency that is based on a resonant frequency of the second speaker 182, such as set at a frequency that is higher than the resonant frequency of the second speaker 182, to control speaker excursion by attenuating the amount of cross-feed signal energy around the resonant frequency of the second speaker 182 that may otherwise be added into the adjusted right audio signal 170.

The first cross-feed filter path 154 applies the first low-pass filter 312 to a received signal (e.g., the output of the first high-pass filter 310) and generates a low-pass filtered output. In some implementations, the first low-pass filter 312 has a first low-pass cut-off frequency that reduces or eliminates high-frequency components that may generate perceptible artifacts due to relatively small movements of the listener's head. The low-pass filtered output is provided to an input of the first cross filter 156.

The first cross-feed filter path 154 applies the first gain 314 to the output of the first cross filter 156 to generate a first gain-adjusted output of the first cross-feed filter path 154. For example, the first gain adjusted output may be provided to the second combiner 166 as the output of the first cross-feed filter path 154.

Similarly, the second cross-feed filter path 160 applies the second high-pass filter 320 to a received signal (e.g., the boosted right audio signal 142) and generates a high-pass filtered output. The first high-pass filter 310 may have a second cut-off frequency that is based on a resonant frequency of the first speaker 180, such as set at a frequency that is higher than the resonant frequency of the first speaker 180. In an illustrative, non-limiting example, the resonant frequency of each of the first speaker 180 and the second speaker 182 may be substantially similar and within the range of 500 Hz to 1200 Hz, and the cut-off frequencies of each of the first high-pass filter 310 and the second high-pass filter 320 may be set to a particular offset (e.g., 200 Hz) above resonance.

The second cross-feed filter path 160 applies the second low-pass filter 322 to a received signal (e.g., the output of the first high-pass filter 310) and generates a low-pass filtered output. In some implementations, the second low-pass filter 322 has a second low-pass cut-off frequency that matches that of the first low-pass filter 312. The low-pass filtered output is provided to an input of the second cross filter 162.

The second cross-feed filter path 160 applies the second gain 324 to the output of the second cross filter 162 to generate a second gain-adjusted output of the second cross-feed filter path 160. For example, the second gain adjusted output may be provided to the first combiner 164 as the output of the second cross-feed filter path 160.

According to an aspect, each of the high-pass filters 310, 320, the low-pass filters 312, 322, the cross filters 156, 162, and the gains 314, 324 are linear filters. As a result, two or more of the filters may be combined (e.g., the cross filter 156 may include the first gain 314), two or more of the filters may be arranged in a different order than illustrated, or any combination thereof.

The cross filters 156 and 162 are configured to enable cross-talk cancellation, as described previously. The high-pass filters 310, 320 control the lower limit of the frequency band in which the crosstalk-cancellation is performed, and the low-pass filters 312, 322 control the upper limit of the frequency band. In a particular implementation, the lower limit (high-pass cutoff) is set to control the output signal's energy at low frequencies (at and below the resonance frequency) where the speaker output is limited by excursion. In a particular implementation, the upper limit (low-pass cutoff) is set to make the stereo widening spatially robust, such as to reduce or eliminate "phasiness artifacts" when a listener's position changes, from an optimal position, relative to the speakers 180 and 182. For example, the low-pass cutoff can be set to a frequency for which the wavelength (in meters) is large (or at least not smaller) relative to head movements (in meters), where "head movements" are displacements of the listener's head from a fixed center position.

According to an aspect, both the high-pass filters 310 and 320 and the low-pass filters 312, 322 are designed to have linear phase to not interfere with the function of the cross filters 156, 162. In some implementations, the first cross-feed filter path 154 includes the first high-pass filter 310, the first low-pass filter 312, and the cross filter 156 combined into one functional block, such as a single finite impulse response (FIR) filter, which may also apply the first gain 314 (e.g., a scalar gain factor). The second cross-feed filter path 160 may also include the FIR filter of the first cross-feed filter path 154 in place of the illustrated components.

According to some aspects, the amount of boost and cross-feed together control the amount of stereo widening that is applied, and the amount of boost (e.g., the shape of the boost filters 134 and 138) is determined by the amount of cross-feed (e.g., cross-feed gain). In some implementations, the amount of cross-feed is determined offline as a tuning parameter to make the stereo widening effect stronger or weaker. In some implementations, the amount of boost and cross-feed could be time-variant, such as dynamically controlled based on available headroom or some other criterion. In an example, the cross-feed gain and the filters vary over time (e.g., using a control signal), vary with volume control setting, or both. Such variation can enable more stereo widening (e.g., provide a stronger stereo widening effect, provide a stereo widening effect that extends to lower frequencies, or both) when headroom allows.

As described above, crosstalk cancellation filtering tends to add more energy to each channel's signal by boosting certain frequencies at the boost stage 130 and due to combining the output of the cross-feed filter paths 154, 160 with the outputs of the direct filters 158, 152, respectively. One result is higher signal amplitude and also larger speaker excursion, if the energy is added to the band in which the loudspeaker is excursion-sensitive (e.g., around its resonance frequency and below). In some implementations, if the "ideal" crosstalk cancellation filters (e.g., determined by inverting the acoustical transfer function approximation 210) increase amplitude and loudspeaker excursion beyond a threshold amount, the boost filters 134, 138 can be "scaled down" from providing full boost (or "ideal" boost) to providing a smaller amount of boost, or potentially zero boost, to maintain the amplitude and loudspeaker excursion within the threshold amount. To illustrate, full boost may result in an enhanced or optimal frequency-response at the listener's ears but with excursion and amplitude increase, while a reduced amount of boost causes less excursion and amplitude increase, but the resulting sound will have some "coloration" and no longer a "flat" response at the listener's ears.

Such tradeoff between boost and coloration is one technique to control increases in excursion and amplitude. Another technique includes adjusting the cross-feed gain (e.g., the gains 314 and 324), and the high-pass filters 310 and 320 of the cross-feed filter paths 154 and 160 can also be used to control excursion and amplitude. However, adjusting cross-feed gain may impact crosstalk cancellation performance, and adjusting the high-pass filtering may impact the frequency range of the stereo widening effect.

FIG. 4 depicts an example 400 of aspects of decomposition and removal of a boost filter component from a conventional crosstalk cancellation filter configuration. A first configuration 402 depicts a conventional crosstalk cancellation filter configuration, including matching direct filters 410 and 416 and matching cross filters 412 and 414.

A second configuration 404 illustrates a result of a decomposition operation that decomposes the direct filter 410 into a linear-phase "boost filter" 430 and an all-pass filter 440, the cross filter 412 into a linear-phase "boost filter" 432 and a cross filter 442, the cross filter 414 into a linear-phase "boost filter" 434 and a cross filter 444, and the direct filter 416 into a linear-phase "boost filter" 436 and an all-pass filter 446. Each of the linear-phase boost filters 430-436 match each other, and the cross filter 442 matches the cross filter 444. According to an aspect, the all-pass filters 440 and 446 may be pure delays (e.g., without, or with only negligible, filtering modification to the incoming signals).

A third configuration 406 illustrates a result of replacing the linear-phase boost filters 430 and 434 with an equivalent linear-phase boost filter 450, and replacing the linear-phase boost filters 432 and 436 with an equivalent linear-phase boost filter 452. The linear-phase boost filters 450 and 452 are thus removed from the crosstalk cancellation filter matrix, which includes the all-pass filters 440 and 446 and the cross filters 442 and 444. According to an aspect, the linear-phase boost filters 450 and 452 correspond to the first boost filter 134 and the second boost filter 138, respectively, the all-pass filters 440 and 446 correspond to the first direct filter 152 and second direct filter 158, respectively (e.g., the first direct filter 152 and second direct filter 158 may include delay filters), and the cross filters 442 and 444 correspond to the first cross filter 156 and the second cross filter 162, respectively. Although the linear-phase boost filters 450 and 452 are illustrated as preceding the crosstalk cancellation filters (e.g., filters 440-446), in other implementations the linear-phase boost filters 450 and 452 can instead be positioned after the crosstalk cancellation filters.

By implementing the boost filters 450 and 452 separately from the crosstalk cancellation filters 440-446, the boost that is provided in the first configuration 402 by the crosstalk cancellation filters 410-416 can be controlled in the third configuration 406 separately of stereo widening, because the boost filters 450 have no effect on the performance of the crosstalk cancellation. In contrast, in a conventional configuration such as the first configuration 402, the use of increased regularization to control the amount of boost provided by the crosstalk cancellation filters 410-416 degrades crosstalk cancellation performance.

Figure 5:
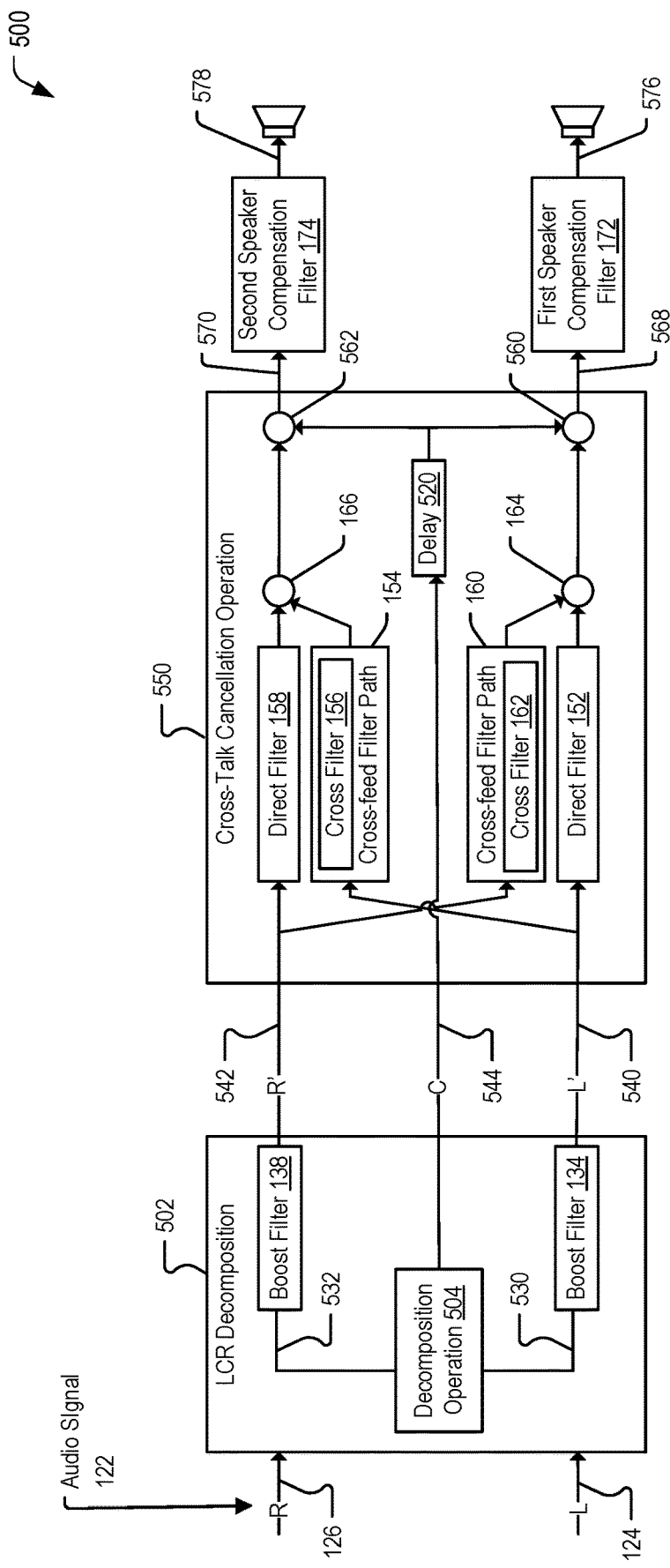
FIG. 5 is a block diagram illustrating a first particular implementation of components that may be used in the system of FIG. 1 in conjunction with stereo widening, in accordance with some examples of the present disclosure.

FIG. 5 depicts an example of a system 500 including components that may be used in the system of FIG. 1 to provide left-center-right (LCR) decomposition in conjunction with stereo widening. To illustrate, the one or more processors 116 of the device 102 of FIG. 1 may implement a LCR decomposition stage 502 that includes a LCR decomposition operation 504. The LCR decomposition stage 502 also includes the first boost filter 134 and the second boost filter 138.

The LCR decomposition operation 504 processes the left audio signal 124 and the right audio signal 126 to generate a left decomposition audio signal 530, a right decomposition audio signal 532, and a center (C) audio signal 544. In a particular example, the left decomposition audio signal 530 represents sounds from left-panned components of the audio signal 122, the right decomposition audio signal 532 represents sounds from right-panned components of the audio signal 122, and the center audio signal 544 represents center-panned components of the audio signal 122. Left-panned components are unique to the left audio signal 124 and right-panned components are unique to the right audio signal 126, such as reverb, uncorrelated, or hard-panned sounds. Center-panned components are common to both the left audio signal 124 and the right audio signal 126 and typically include bass, voices, and center-panned instruments.

The left decomposition audio signal 530 is processed by the first boost filter 134 to generate a boosted left audio signal (L') 540, and the right decomposition audio signal 532 is processed by the second boost filter 138 to generate a boosted right audio signal (R') 542. In a particular implementation, the LCR decomposition stage 502 is performed using windowed fast Fourier transform (FFT) processing that simplifies implementing the boost filters 134 and 138 as dynamic, time-varying filters. In other implementations in which the boost filters 134 and 138 are static, the boost filters 134 and 138 may be applied to the left decomposition audio signal 530 and the right decomposition audio signal 532, respectively, after being output from the LCR decomposition stage 502.

The boosted left audio signal (L') 540 and the boosted right audio signal (R') 542 are processed at a crosstalk cancellation operation 550 in a similar manner as described with reference to the boosted left audio signal 140 and the boosted right audio signal 142, respectively, of FIG. 1. The crosstalk cancellation operation 550 also includes a delay element 520 configured to provide a delayed version of the center audio signal 544 to a third combiner 560 and to a fourth combiner 562. The third combiner 560 is configured to combine the output of the delay element 520 with the output of the first combiner 164 to generate an adjusted left signal 568. The fourth combiner 562 is configured to combine the output of the delay element 520 with the output of the second combiner 166 to generate an adjusted right signal 570. As a result, the adjusted left signal 568 and the adjusted right signal 570 are generated at least in part based on the center audio signal 544.

During operation, the LCR decomposition operation 504 obtains the audio signal 122 and performs the LCR decomposition operation 504 on the audio signal 122 to generate the boosted left audio signal 540 based on the left-panned components of the audio signal 122, generate the boosted right audio signal 542 based on the right-panned components of the audio signal 122, and generate the center audio signal 544 based on the center-panned components of the audio signal 122. The crosstalk cancellation operation 550 applies the direct filter 152 and the cross-feed filter path 160 to the boosted left audio signal 540 and applies the direct filter 158 and the cross-feed filter path 154 to the boosted right audio signal 542 to generate adjusted left and right audio signals at the combiners 164 and 166, respectively.

The delay element 520 applies a delay to the center audio signal 544 that matches the delay caused by the crosstalk cancellation filters (e.g., the direct filters 152 and 158 and the cross-feed filter paths 154 and 160) and the combiners 164 and 166. The delayed center audio signal 544 is combined, at the third combiner 560, with the output of the first combiner 164 to generate the adjusted left signal 568. The delayed center audio signal 544 is also combined, at the fourth combiner 562, with the output of the second combiner 166 to generate the adjusted right signal 570. The adjusted left signal 568 is processed by the first speaker compensation filter 172 to generate a left output signal 576, and the adjusted right signal 570 is processed by the second speaker compensation filter 174 to generate a right output signal 578.

As a result, center-panned content in the audio signal 122 is routed to the speakers without processing by the crosstalk cancellation filters. Similarly, low frequency content of the audio signal 122 is largely unprocessed due to filter design (e.g., high-pass filtering in the cross-feed filter paths 154 and 160) and also because low-frequency content tends to be center-panned. Stereo widening is therefore only applied to unique left-panned and right-panned signal components that are above a cutoff frequency. In some implementations, the filter gain of the cross-feed filter paths 154 and 160 is adjustable, resulting in an amount of crosstalk cancellation, which enables an adjustable tradeoff between filter gain and coloration at the listener's ear. Use of the speaker compensation filters 172 and 174 enables determination of the filter parameters for the boost filters and the cross filters as described with reference to FIG. 2 and without requiring measurements using the particular speakers. In addition, the illustrated configuration enables separate equalization, speaker compensation, and crosstalk filter, along with separate tuning procedures.

Figure 6:
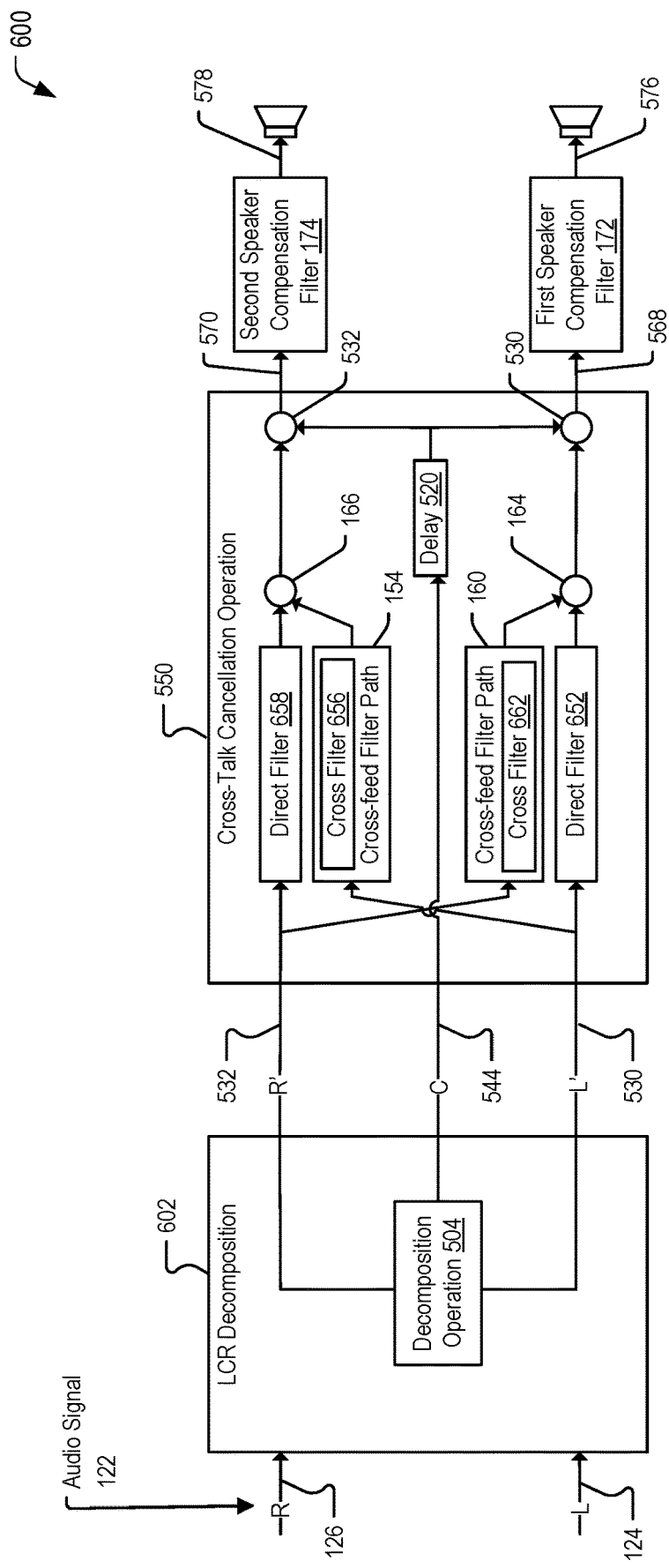
FIG. 6 is a block diagram illustrating a second particular implementation of components that may be used in the system of FIG. 1 in conjunction with stereo widening, in accordance with some examples of the present disclosure.

FIG. 6 depicts an example of a system 600 that includes components that may be used in the system of FIG. 1 to provide left-center-right (LCR) decomposition in conjunction with stereo widening. An LCR decomposition stage 602 includes the LCR decomposition operation 504 that processes the left audio signal 124 and the right audio signal 126 as described in FIG. 5, but omits the boost filters 134 and 138 of FIG. 5. Instead, signal boosting is performed in the direct filters 652 and 658 and in the cross filters 656 and 662, such as described with reference to the first configuration 402 of FIG. 4.

The LCR decomposition stage 602 outputs the left decomposition audio signal 530, the right decomposition audio signal 532, and the center (C) audio signal 544 of FIG. 5, which are provided as inputs to the crosstalk cancellation operation 550. The remaining components of the crosstalk cancellation operation 550 and the speaker compensation filters 172 and 174 operate substantially as described in FIG. 5.

Although FIG. 5 and FIG. 6 illustrate that the delayed center audio signal 544 is combined into the adjusted left signal 568 and the adjusted right signal 570, in other implementations the delayed center audio signal 544 may additionally, or alternatively, be provided as an input to a dedicated center speaker (not shown).

Figure 7:
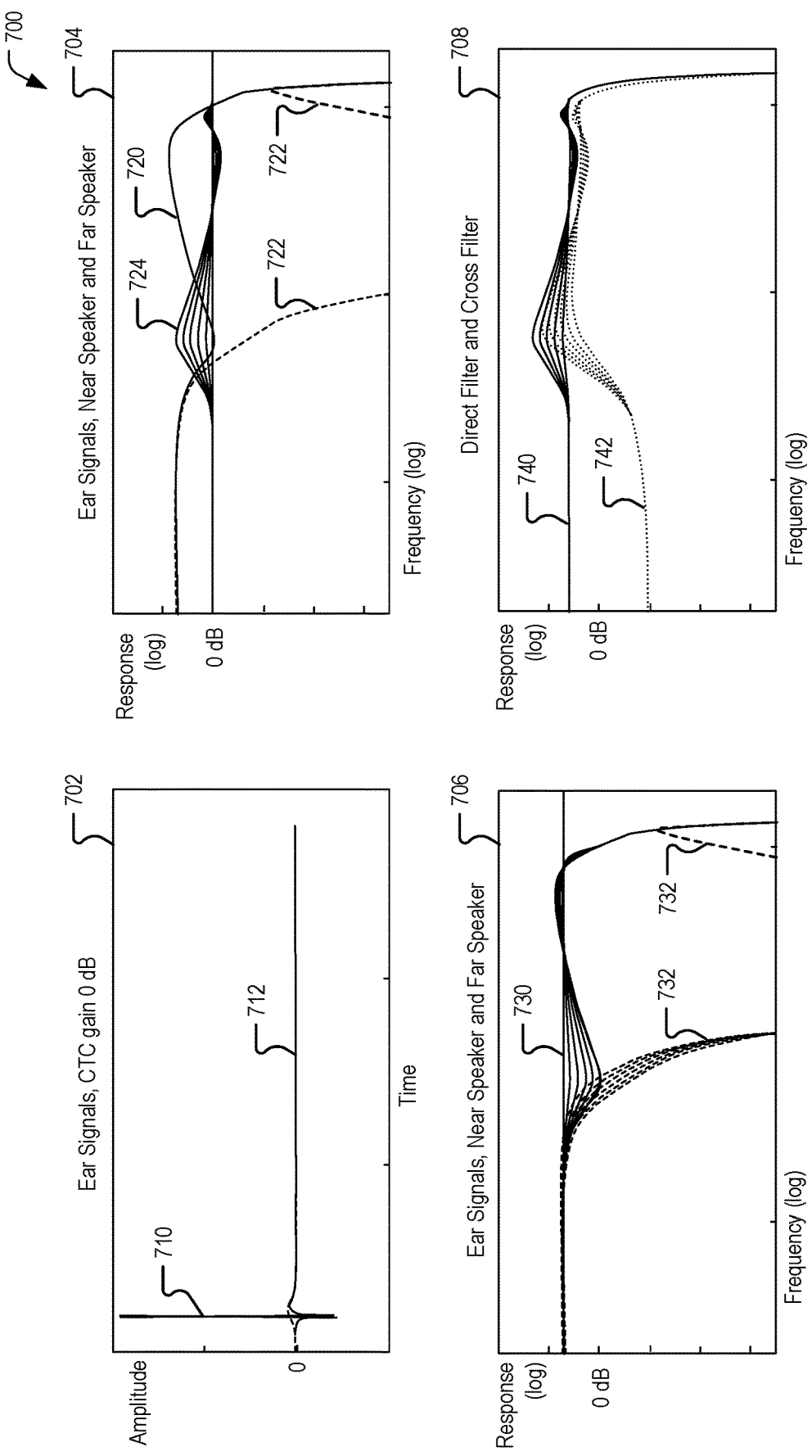
FIG. 7 is a diagram illustrating examples of multiple aspects of performance of the system of FIG. 1.

FIG. 7 depicts examples of multiple aspects of performance of the system 100 of FIG. 1. A first diagram 702 depicts a first impulse response 710 that corresponds to a near-side performance of the system 100, such as for sound of the left audio signal 124 arriving at the left ear 188 illustrated in FIG. 1. A second impulse response 712 corresponds to a far-side performance of the system 100, such as for sound of the right audio signal 126 arriving at the left ear 188. Alternatively, due to symmetry, the near-side performance can correspond to the right audio signal 126 arriving at the right ear 190, and the far-side performance can correspond to the left audio signal 124 arriving at the right ear 190. In FIG. 7, near-side performance is illustrated using solid lines, and far-side performance is illustrated using dashed lines.

A second diagram 704 illustrates a near-side frequency response 720 corresponding to the first impulse response 710 and a far-side frequency response 722 corresponding to the second impulse response 712, in the absence of any boost provided by the boost filters 134 and 138. In a particular example, the far-side frequency response 722 begins to roll off at 100-200 (Hz) (e.g., due to the high-pass filters 310 and 320 of FIG. 3) and reaches −35 dB at about 1 kHz. The far-side frequency response 722 provides large suppression of the far-side signal (e.g., very little crosstalk perceived by the listener) for frequencies higher than 1 kHz. As illustrated, the far-side frequency response 722 increases for upper frequencies (e.g., in the range of 10 kHz-20 kHz), such as to reduce "phasiness artifacts" as described with reference to the low-pass filters 312 and 322 of FIG. 3.

The second diagram 704 also illustrates a set of boost frequency response curves 724 corresponding to the boost filters 134 and 138 for multiple boost values, from zero boost (the line at zero dB) to full boost (the highest amplitude frequency response curve). Although described as "boost" filters, in some implementations, the boost filters 134 and 138 may also produce, for some frequencies, attenuation that is smaller in magnitude than the peak amplification produced by the boost filters 134 and 138.

A third diagram 706 illustrates a first set of near-side frequency response curves 730 and a second set of far-side frequency response curves 732, corresponding to incorporating the boost filtering at the multiple boost values illustrated in the second diagram 704.

A fourth diagram 708 illustrates a first set of frequency response curves 740 and a second set of frequency response curves 742 corresponding to magnitudes of the crosstalk cancellation filters incorporating the boost filtering at the multiple boost values illustrated in the second diagram 704.

As illustrated in FIG. 7, the amount of boost determines coloration at the listener's ear, with ideal boost producing a flat response, and lower boost values resulting in increased coloration. However, the amount of boost does not affect (or only minimally affects) cancellation performance, such as illustrated in the third diagram 706. In some implementations, the amount of boost can be modified to make a trade-off between filter boost (e.g., which may be impacted by limited headroom) and coloration.

In some implementations, the maximum excursion sensitivity of the speakers occurs in the frequency range of the largest frequency responses illustrated in the fourth diagram 708, such as in the range 500-1000 Hz. Potential speaker excursion issues may be mitigated by only applying the crosstalk filters to side signals in implementations that include LCR decomposition (e.g., as illustrated in FIG. 5 or FIG. 6), by trading boost against coloration, reducing the stereo widening amount (e.g., adjusting crosstalk filter gain), or adjusting the high-pass filtering to avoid this frequency range.

Figure 8:
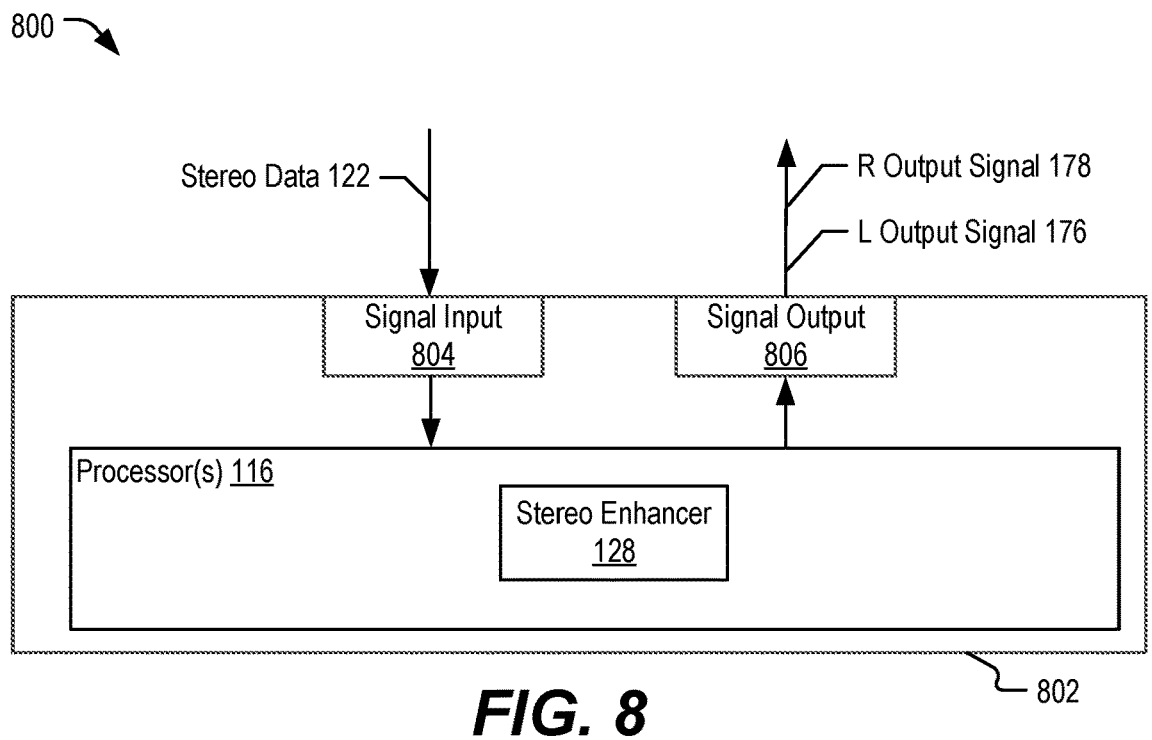
FIG. 8 is a block diagram illustrating an implementation of an integrated circuit operable to perform audio crosstalk cancellation that may be used for stereo widening, in accordance with some examples of the present disclosure.

FIG. 8 is a block diagram illustrating an implementation 800 of the device 102 as an integrated circuit 802 for performing audio crosstalk cancellation for stereo widening. The integrated circuit 802 includes the one or more processors 116. The one or more processors 116 include the stereo enhancer 128. The integrated circuit 802 also includes a signal input 804, such as a bus interface, to enable the audio signal 122 to be received. The integrated circuit 802 also includes a signal output 806, such as a bus interface, to enable outputting the left output signal 176 and the right output signal 178. The integrated circuit 802 enables implementation of crosstalk cancellation for stereo widening as a component in a system that performs audio playback, as depicted in FIG. 1.

FIG. 9 depicts an implementation 900 in which the device 102 includes a mobile device 902, such as a phone or tablet, as illustrative, non-limiting examples. The mobile device 902 includes a microphone 936, the speakers 180 and 182, and a display screen 904 (e.g., the display device 198). Components of the one or more processors 116, including the stereo enhancer 128, are integrated in the mobile device 902 and are illustrated using dashed lines to indicate internal components that are not generally visible to a user of the mobile device 902. In a particular example, the stereo enhancer 128 operates to perform crosstalk cancellation for stereo widening for playout via the speakers 180 and 182.

FIG. 10 depicts an implementation 1000 of a wearable electronic device 1002, illustrated as a "smart watch." In a particular aspect, the wearable electronic device 1002 includes the device 102.

The stereo enhancer 128 is integrated into the wearable electronic device 1002. In a particular aspect, the wearable electronic device 1002 is coupled to or includes the speakers 180 and 182. In a particular example, the stereo enhancer 128 operates to perform crosstalk cancellation for stereo widening, In a particular example, the wearable electronic device 1002 includes a haptic device that provides a haptic notification (e.g., vibrates) indicating a stereo widening configuration. For example, the haptic notification can cause a user to look at the wearable electronic device 1002 to see a displayed notification indicating that the stereo widening is being adjusted (e.g., dynamic parameter adjustment to reduce speaker excursion). The wearable electronic device 1002 can thus alert a user when stereo widening is being modified.

FIG. 11 is an implementation 1100 of a wireless speaker and voice activated device 1102. In a particular aspect, the wireless speaker and voice activated device 1102 includes the device 102 of FIG. 1.

The wireless speaker and voice activated device 1102 can have wireless network connectivity and is configured to execute an assistant operation. The one or more processors 116 including the stereo enhancer 128 are included in the wireless speaker and voice activated device 1102. In a particular aspect, the wireless speaker and voice activated device 1102 includes or is coupled to the one or more speakers 180 and 182. During operation, the stereo enhancer 128 performs crosstalk cancellation for stereo widening during playback of stereo data via the speakers 180 and 182. In response to receiving a verbal command identified as user speech in the resolution adjusted audio, the wireless speaker and voice activated device 1102 can execute assistant operations, such as via execution of a voice activation system (e.g., an integrated assistant application). The assistant operations can include adjusting a temperature, playing music, turning on lights, etc. For example, the assistant operations are performed responsive to receiving a command after a keyword or key phrase (e.g., "hello assistant").

FIG. 12 depicts an implementation 1200 in which the device 102 includes a portable electronic device that corresponds to a camera device 1202. The stereo enhancer 128, the speakers 180 and 182, or a combination thereof, are included in the camera device 1202. During operation, the stereo enhancer 128 performs crosstalk cancellation for stereo widening during playback of stereo data via the speakers 180 and 182.

FIG. 13 depicts an implementation 1300 in which the device 102 corresponds to or is integrated within a vehicle 1302, illustrated as a manned or unmanned aerial device (e.g., a package delivery drone). In some implementations, the one or more processors 116 (e.g., including the stereo enhancer 128) are integrated into the vehicle 1302. In a particular aspect, the vehicle 1302 includes or is coupled to the first speaker 180 and the second speaker 182. The first speaker 180 is configured to generate first sound during playback, the first sound generated based on the left output signal 176, and the second speaker 182 is configured to generate second sound during playback, the second sound generated based on the right output signal 178.

The stereo enhancer 128 performs crosstalk cancellation for stereo widening during playback of stereo data via the speakers 180 and 182. In some implementations, the vehicle 1302 is manned (e.g., carries a pilot, one or more passengers, or both) and the stereo widening is used during playback to a pilot or a passenger of the vehicle 1302. In another implementation in which the vehicle 1302 is unmanned and the speakers 180 and 182 are on an external surface of the vehicle 1302, the stereo widening is used during playback for a listener that is external to the vehicle 1302. For example, the vehicle 1302 may move (e.g., circle an outdoor audience during a concert) while playing out audio, and the one or more processors 116 (e.g., including the stereo enhancer 128) may perform crosstalk cancellation for stereo widening during playback of stereo data via the speakers 180 and 182.

FIG. 14 depicts an implementation 1400 in which the device 102 corresponds to, or is integrated within, a vehicle 1402, illustrated as a car that also includes the first speaker 180 and the second speaker 182. The first speaker 180 is configured to generate first sound during playback, the first sound generated based on the left output signal 176 of FIG. 1, and the second speaker 182 is configured to generate second sound during playback, the second sound generated based on the right output signal 178. In some implementations, the one or more processors 116 (e.g., including the stereo enhancer 128) are integrated into the vehicle 1402, and a separate pair of speakers is provided for each passenger of the vehicle 1402, such as relatively closely-spaced pair of speakers mounted in the headrest of the seat in front of each passenger, enabling each passenger to listen to their own audio output with a perception of wider-spaced sources than the physical separation between their speakers, and also helping to isolate each occupant's audio output from the other occupants by increasing the distance between adjacent pairs of speakers.

Figure 15:
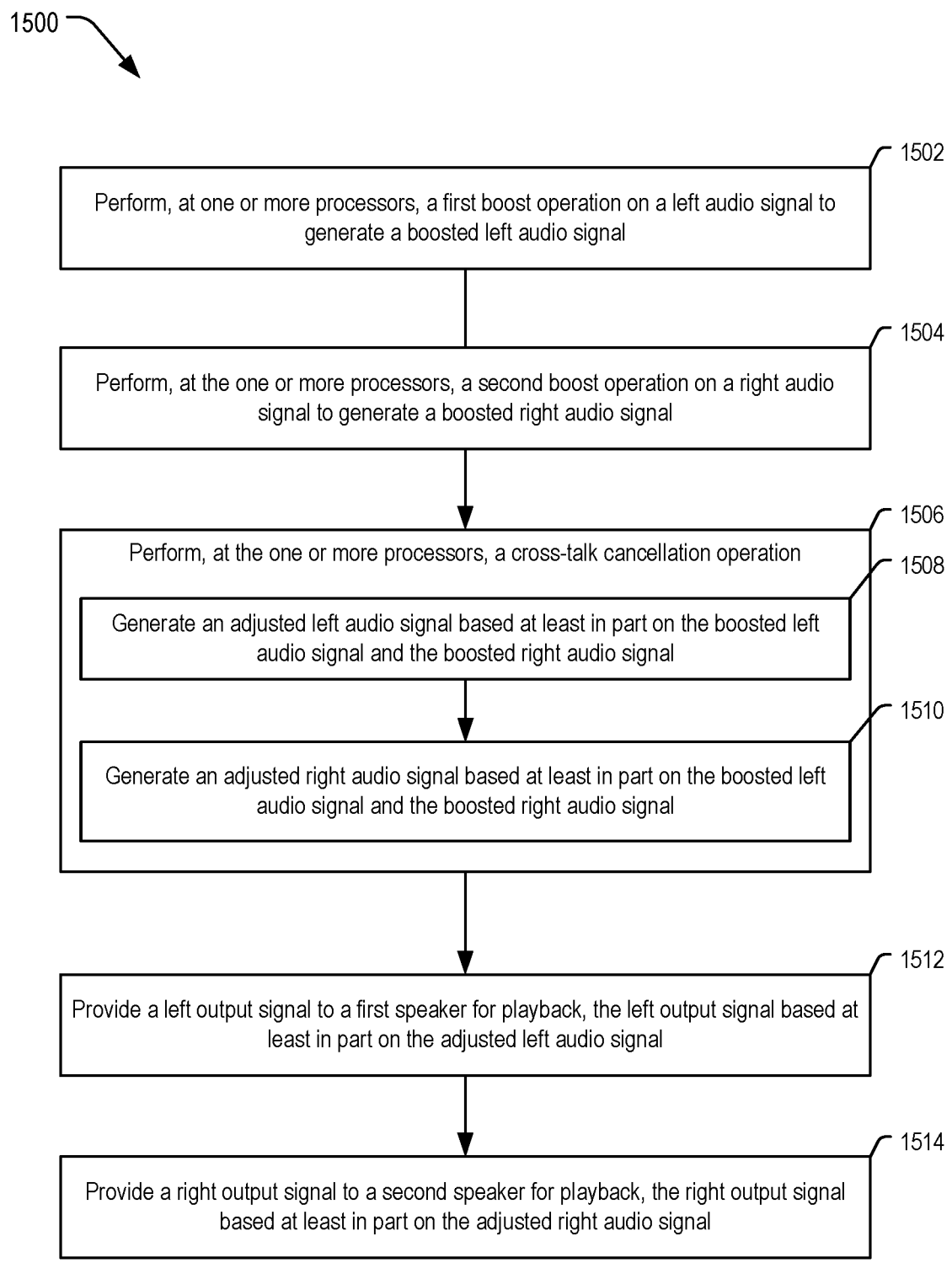
FIG. 15 is a diagram of a particular implementation of a method of performing audio crosstalk cancellation that may be used for stereo widening, in accordance with some examples of the present disclosure.

FIG. 15 illustrates an example of a method 1500 of performing audio crosstalk cancellation that may be used for stereo widening. One or more operations of the method 1500 may be performed by the system 100 of FIG. 1 (e.g., the one or more processors 116), the system 200 of FIG. 2, the system 500 of FIG. 5, the system 600 of FIG. 6, or a combination thereof, as illustrative, non-limiting examples.

The method 1500 includes performing, at one or more processors, a first boost operation on a left audio signal to generate a boosted left audio signal, at 1502, and performing, at the one or more processors, a second boost operation on a right audio signal to generate a boosted right audio signal, at 1504. For example, the one or more processors 116 perform the first boost operation 132 on the left audio signal 124 to generate the boosted left audio signal 140 and perform the second boost operation 136 on the right audio signal 126 to generate the boosted right audio signal 142. According to some implementations, first boost parameters associated with the first boost operation, second boost parameters associated with the second boost operation, and parameters associated with the crosstalk cancellation operation are dynamically controlled based on an amount of available headroom. For example, the filter parameters 133 and 139 for the boost filters 134 and 138, the filter coefficients 157 and 163 (e.g., gain or high-pass filtering) associated with the cross-feed filter paths 154 and 160, or both, may be dynamically adjusted.

The method 1500 includes performing, at the one or more processors, a crosstalk cancellation operation, at 1506. The crosstalk cancellation operation includes generating an adjusted left audio signal based at least in part on the boosted left audio signal and the boosted right audio signal, at 1508. The crosstalk cancellation operation also includes generating an adjusted right audio signal based at least in part on the boosted left audio signal and the boosted right audio signal, at 1510. In some implementations, filter parameters associated with the crosstalk cancellation operation are independent of inter-speaker differences between a first speaker and a second speaker. To illustrate, the crosstalk cancellation operation 150 generates the adjusted left audio signal 168 and the adjusted right audio signal 170 based on the boosted left audio signal 140 and the boosted right audio signal 142, respectively, and the filter coefficients 153, 157, 159, and 163 are independent of differences between the first speaker 180 and the second speaker 182.

The method 1500 includes providing a left output signal to a first speaker for playback, the left output signal based at least in part on the adjusted left audio signal, at 1512. The method 1500 also includes providing a right output signal to a second speaker for playback, the right output signal based at least in part on the adjusted right audio signal, at 1514. For example, the one or more processors 116 provide the left output signal 176 to the first speaker 180 and provide the right output signal 178 to the second speaker 182. In another example, providing the left output signal to the first speaker for playback is performed via a first crossover device that is coupled to a first set of speakers including the first speaker 180, providing the right output signal to the second speaker is performed via a second crossover device that is coupled to a second set of speakers including the second speaker 182, or a combination thereof. In some implementations, the left output signal is also provided to one or more additional speakers, the right output signal is also provided to one or more additional speakers, or a combination thereof.

In some implementations, the method 1500 includes providing the adjusted left audio signal to a first speaker compensation filter (e.g., the first speaker compensation filter 172) and providing the adjusted right audio signal to a second speaker compensation filter (e.g., the second speaker compensation filter 174). The first speaker compensation filter is configured to perform a first equalization operation on the adjusted left audio signal to adjust a first speaker response of the first speaker, and the second speaker compensation filter is configured to perform a second equalization operation on the adjusted right audio signal to adjust a second speaker response of the second speaker. In an example, filter parameters for the first speaker compensation filter and the second speaker compensation filter (e.g., the filter parameters 173 and 175) are based on the inter-speaker differences between the first speaker and the second speaker.

In some implementations, performing the crosstalk cancellation operation further includes providing the boosted left audio signal as an input to a first direct filter (e.g., the first direct filter 152) and as an input to a first cross-feed filter path that includes a first cross filter (e.g., the first cross filter 156), providing the boosted right audio signal as an input to a second direct filter (e.g., the second direct filter 158) and as an input to a second cross-feed filter path that includes a second cross filter (e.g., the second cross filter 162), generating the adjusted left audio signal based at least in part on an output of the first direct filter and an output of the second cross filter (e.g., via the first combiner 164), and generating the adjusted right audio signal based at least in part on an output of the second direct filter and an output of the first cross filter (e.g., via the second combiner 166).

The method 1500 of FIG. 15 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 1500 of FIG. 15 may be performed by a processor that executes instructions, such as described with reference to FIG. 16.

Figure 16:
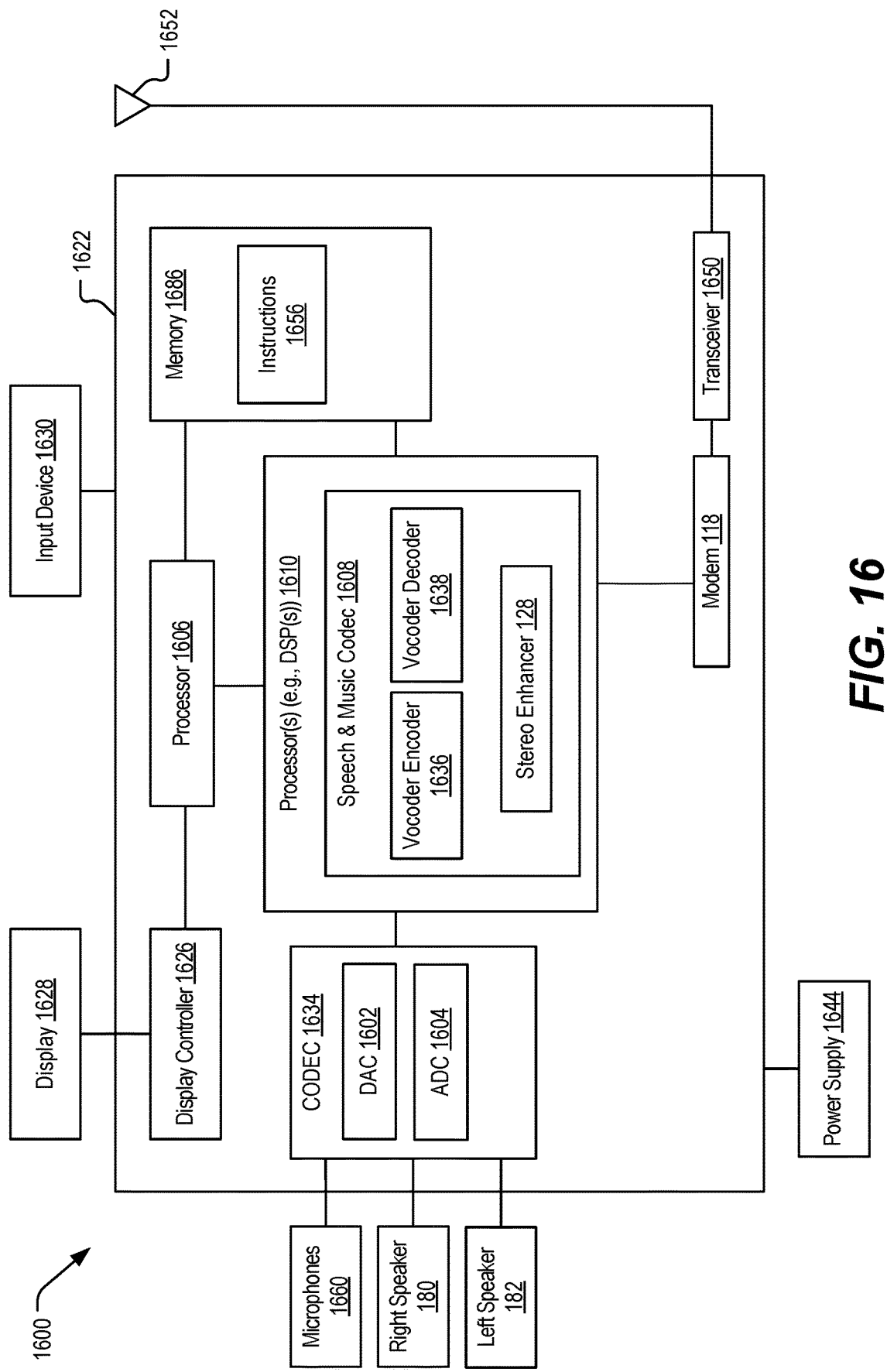
FIG. 16 is a block diagram of a particular illustrative example of a device that is operable to perform audio crosstalk cancellation that may be used for stereo widening, in accordance with some examples of the present disclosure.

Referring to FIG. 16, a block diagram of a particular illustrative implementation of a device is depicted and generally designated 1600. In various implementations, the device 1600 may have more or fewer components than illustrated in FIG. 16. In an illustrative implementation, the device 1600 may correspond to the device 102 of FIG. 1. In an illustrative implementation, the device 1600 may perform one or more operations described with reference to FIGS. 1-15.

In a particular implementation, the device 1600 includes a processor 1606 (e.g., a CPU). The device 1600 may include one or more additional processors 1610 (e.g., one or more DSPs). In a particular implementation, the one or more processors 116 of FIG. 1 correspond to the processor 1606, the processors 1610, or a combination thereof. For example, the processors 1610 may include a speech and music coder-decoder (CODEC) 1608. The speech and music codec 1608 may include a voice coder ("vocoder") encoder 1636, a vocoder decoder 1638, the stereo enhancer 128, or a combination thereof.

The device 1600 may include a memory 1686 and a CODEC 1634. The memory 1686 may include instructions 1656, that are executable by the one or more additional processors 1610 (or the processor 1606) to implement the functionality described with reference to the stereo enhancer 128. In a particular example, the memory 1686 corresponds to the memory 110 and the instructions 1656 correspond to the instructions 112 of FIG. 1. The device 1600 may include the modem 118 coupled, via a transceiver 1650, to an antenna 1652.

The device 1600 may include a display 1628, such as the display device 198, coupled to a display controller 1626. The speakers 180 and 182, one or more microphones 1660, or a combination thereof, may be coupled to the CODEC 1634. The CODEC 1634 may include a digital-to-analog converter (DAC) 1602 and an analog-to-digital converter (ADC) 1604. In a particular implementation, the CODEC 1634 may receive analog signals from the microphones 1660, convert the analog signals to digital signals using the analog-to-digital converter 1604, and send the digital signals to the speech and music codec 1608. In a particular implementation, the speech and music codec 1608 may provide digital signals to the CODEC 1634. The CODEC 1634 may convert the digital signals to analog signals using the digital-to-analog converter 1602 and may provide the analog signals to the speakers 180 and 182.

In a particular implementation, the device 1600 may be included in a system-in-package or system-on-chip device 1622. In a particular implementation, the memory 1686, the processor 1606, the processors 1610, the display controller 1626, the CODEC 1634, and the modem 118 are included in a system-in-package or system-on-chip device 1622. In a particular implementation, an input device 1630 (e.g., a keyboard, a touchscreen, or a pointing device) and a power supply 1644 are coupled to the system-in-package or system-on-chip device 1622. Moreover, in a particular implementation, as illustrated in FIG. 16, the display 1628, the input device 1630, the speakers 180 and 182, the microphones 1660, the antenna 1652, and the power supply 1644 are external to the system-in-package or system-on-chip device 1622. In a particular implementation, each of the display 1628, the input device 1630, the speakers 180 and 182, the microphones 1660, the antenna 1652, and the power supply 1644 may be coupled to a component of the system-in-package or system-on-chip device 1622, such as an interface or a controller.

The device 1600 may include a smart speaker, a speaker bar, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a headset, an augmented reality headset, a mixed reality headset, a virtual reality headset, an aerial vehicle, a home automation system, a voice-activated device, a wireless speaker and voice activated device, a portable electronic device, a car, a vehicle, a computing device, a communication device, an internet-of-things (IoT) device, a virtual reality (VR) device, a base station, a mobile device, or any combination thereof.

In conjunction with the described techniques, an apparatus includes means for performing a first boost operation on a left audio signal to generate a boosted left audio signal. In an example, the means for performing the first boost operation includes the first boost filter 134, the boost stage 130, the stereo enhancer 128, the one or more processors 116, the device 102, one or more other circuits or devices to perform the first boost operation, or a combination thereof.

In conjunction with the described techniques, the apparatus includes means for performing a second boost operation on a right audio signal to generate a boosted right audio signal. In an example, the means for performing the second boost operation includes the second boost filter 138, the boost stage 130, the stereo enhancer 128, the one or more processors 116, the device 102, one or more other circuits or devices to perform a second boost operation on a right audio signal to generate a boosted right audio signal, or a combination thereof.

In conjunction with the described techniques, the apparatus includes means for performing a crosstalk cancellation operation that includes generation of an adjusted left audio signal based at least in part on the boosted left audio signal and the boosted right audio signal and generation of an adjusted right audio signal based at least in part on the boosted left audio signal and the boosted right audio signal. In some implementations, filter parameters associated with the crosstalk cancellation operation are independent of inter-speaker differences between a first speaker and a second speaker. In an example, the means for performing the crosstalk cancellation operation includes the first direct filter 152, the second direct filter 158, the first cross-feed filter path 154, the first cross filter 156, the second cross-feed filter path 160, the second cross filter 162, the first combiner 164, the second combiner 166, the stereo enhancer 128, the one or more processors 116, the device 102, the filters 412-414 of FIG. 4, the first direct filter 652, the second direct filter 658, the first cross filter 656, the second cross filter 662 of FIG. 6, one or more other circuits or devices to perform the crosstalk cancellation operation, or a combination thereof.

In conjunction with the described techniques, the apparatus includes means for providing a left output signal for playback at a first speaker, the left output signal based at least in part on the adjusted left audio signal. In an example, the means for providing the left output signal includes the first speaker compensation filter 172, the stereo enhancer 128, the one or more processors 116, the device 102, the one or more other circuits or devices to provide a left output signal for playback at the first speaker, the left output signal based at least in part on the adjusted left audio signal, or a combination thereof.

In conjunction with the described techniques, the apparatus includes means for providing a right output signal for playback at a second speaker, the right output signal based at least in part on the adjusted right audio signal. In an example, the means for providing the right output signal includes the second speaker compensation filter 174, the stereo enhancer 128, the one or more processors 116, the device 102, one or more other circuits or devices to provide a right output signal for playback at the second speaker, the right output signal based at least in part on the adjusted right audio signal, or a combination thereof.

In some implementations, a non-transitory computer-readable medium (e.g., a computer-readable storage device, such as the memory 110) includes instructions (e.g., the instructions 112) that, when executed by one or more processors (e.g., the one or more processors 116), cause the one or more processors to perform operations corresponding to at least a portion of any of the techniques described with reference to FIGS. 1-14, the method of FIG. 15, or any combination thereof.

Particular aspects of the disclosure are described below in the following sets of interrelated clauses:

According to Clause 1, a device includes: a memory configured to store instructions; and one or more processors configured to execute the instructions to: perform a first boost operation on a left audio signal to generate a boosted left audio signal; perform a second boost operation on a right audio signal to generate a boosted right audio signal; perform a crosstalk cancellation operation that includes generation of an adjusted left audio signal based at least in part on the boosted left audio signal and the boosted right audio signal and generation of an adjusted right audio signal based at least in part on the boosted left audio signal and the boosted right audio signal; provide a left output signal for playback at a first speaker, the left output signal based at least in part on the adjusted left audio signal; and provide a right output signal for playback at a second speaker, the right output signal based at least in part on the adjusted right audio signal.

Clause 2. The device of Clause 1, wherein filter parameters associated with the crosstalk cancellation operation are independent of inter-speaker differences between a first speaker and a second speaker.

Clause 3. The device of Clause 1 or Clause 2, wherein each of the first boost operation and the second boost operation corresponds to a frequency-dependent linear filtering operation.

Clause 4. The device of any of Clause 1 to Clause 3, wherein the one or more processors are configured to execute the instructions to: provide the adjusted left audio signal to a first speaker compensation filter, the first speaker compensation filter configured to perform a first equalization operation on the adjusted left audio signal to adjust a first speaker response of the first speaker; and provide the adjusted right audio signal to a second speaker compensation filter, the second speaker compensation filter configured to perform a second equalization operation on the adjusted right audio signal to adjust a second speaker response of the second speaker, wherein filter parameters for the first speaker compensation filter and filter parameters for the second speaker compensation filter are based on inter-speaker differences between the first speaker and the second speaker.

Clause 5. The device of any of Clause 1 to Clause 4, wherein, during performance of the crosstalk cancellation operation, the one or more processors are configured to execute the instructions to: provide the boosted left audio signal as an input to a first direct filter and as an input to a first cross-feed filter path that includes a first cross filter; provide the boosted right audio signal as an input to a second direct filter and as an input to a second cross-feed filter path that includes a second cross filter; generate the adjusted left audio signal based at least in part on an output of the first direct filter and an output of the second cross filter; and generate the adjusted right audio signal based at least in part on an output of the second direct filter and an output of the first cross filter.

Clause 6. The device of Clause 5, wherein the one or more processors are configured to execute the instructions to: apply a first gain to the output of the first cross filter to generate a first gain-adjusted output of the first cross-feed filter path, wherein the adjusted right audio signal is generated based on the output of the second direct filter and the first gain-adjusted output; and apply a second gain to the output of the second cross filter to generate a second gain-adjusted output of the second cross-feed filter path, wherein the adjusted left audio signal is generated based on the output of the first direct filter and the second gain-adjusted output.

Clause 7. The device of Clause 5 or Clause 6, wherein the first cross-feed filter path further includes at least a first high-pass filter having a first cut-off frequency that is based on a resonant frequency of the second speaker, and wherein the second cross-feed filter path further includes at least a second high-pass filter having a second cut-off frequency that is based on a resonant frequency of the first speaker.

Clause 8. The device of any of Clause 5 to Clause 7, wherein filter parameters associated with the crosstalk cancellation operation include: first filter coefficients associated with the first direct filter; second filter coefficients associated with the second direct filter, wherein the first filter coefficients match the second filter coefficients; third filter coefficients associated with the first cross filter; and fourth filter coefficients associated with the second cross filter, wherein the third filter coefficients match the fourth filter coefficients.

Clause 9. The device of any of Clause 5 to Clause 8, wherein the first direct filter and the second direct filter include delay filters.

Clause 10. The device of any of Clause 1 to Clause 9, wherein the one or more processors are configured to execute the instructions to: obtain an audio signal; and perform a left-center-right (LCR) decomposition operation on the audio signal to: generate the left audio signal based on left-panned components of the audio signal; generate the right audio signal based on right-panned components of the audio signal; and generate a center audio signal based on center-panned components of the audio signal.

Clause 11. The device of Clause 10, wherein the adjusted left signal and the adjusted right signal are generated at least in part based on the center audio signal.

Clause 12. The device of any of Clause 1 to Clause 11, further including a modem coupled to the one or more processors, the modem configured to receive the left audio signal and the right audio signal from a second device.

Clause 13. The device of any of Clause 1 to Clause 12, wherein the one or more processors are integrated in at least one of a mobile phone, a tablet computer device, a wearable electronic device, or a camera device, a virtual reality headset, a mixed reality headset, or an augmented reality headset.

Clause 14. The device of any of Clause 1 to Clause 12, wherein the one or more processors are integrated in at least one of a mobile phone, a tablet computer device, or a camera device.

Clause 15. The device of any of Clause 1 to Clause 12, wherein the one or more processors are integrated in a wearable electronic device.

Clause 16. The device of any of Clause 1 to Clause 12, wherein the one or more processors are integrated in at least one of a virtual reality headset, a mixed reality headset, or an augmented reality headset.

Clause 17. The device of any of Clause 1 to Clause 12, wherein the one or more processors are integrated in a vehicle, the vehicle further including: the first speaker configured to generate first sound during playback, the first sound generated based on the left output signal; and the second speaker configured to generate second sound during playback, the second sound generated based on the right output signal.

According to Clause 18, a method includes: performing, at one or more processors, a first boost operation on a left audio signal to generate a boosted left audio signal; performing, at the one or more processors, a second boost operation on a right audio signal to generate a boosted right audio signal; performing, at the one or more processors, a crosstalk cancellation operation, the crosstalk cancellation operation including: generating an adjusted left audio signal based at least in part on the boosted left audio signal and the boosted right audio signal; and generating an adjusted right audio signal based at least in part on the boosted left audio signal and the boosted right audio signal; providing a left output signal to a first speaker for playback, the left output signal based at least in part on the adjusted left audio signal; and providing a right output signal to a second speaker for playback, the right output signal based at least in part on the adjusted right audio signal.

Clause 19. The method of Clause 18, further including: providing the adjusted left audio signal to a first speaker compensation filter, the first speaker compensation filter configured to perform a first equalization operation on the adjusted left audio signal to adjust a first speaker response of the first speaker; and providing the adjusted right audio signal to a second speaker compensation filter, the second speaker compensation filter configured to perform a second equalization operation on the adjusted right audio signal to adjust a second speaker response of the second speaker.

Clause 20. The method of Clause 18 or Clause 19, wherein filter parameters for the first speaker compensation filter and the second speaker compensation filter are based on inter-speaker differences between the first speaker and the second speaker, and wherein filter parameters associated with the crosstalk cancellation operation are independent of the inter-speaker differences between the first speaker and the second speaker.

Clause 21. The method of any of Clause 18 to Clause 20, wherein performing the crosstalk cancellation operation further includes: providing the boosted left audio signal as an input to a first direct filter and as an input to a first cross-feed filter path that includes a first cross filter; providing the boosted right audio signal as an input to a second direct filter and as an input to a second cross-feed filter path that includes a second cross filter; generating the adjusted left audio signal based at least in part on an output of the first direct filter and an output of the second cross filter; and generating the adjusted right audio signal based at least in part on an output of the second direct filter and an output of the first cross filter.

Clause 22. The method of Clause 21, further including: applying a first gain to the output of the first cross filter to generate a first gain-adjusted output of the first cross-feed filter path, wherein the adjusted right audio signal is generated based on the output of the second direct filter and the first gain-adjusted output; and applying a second gain to the output of the second cross filter to generate a second gain-adjusted output of the second cross-feed filter path, wherein the adjusted left audio signal is generated based on the output of the first direct filter and the second gain-adjusted output.

Clause 23. The method of Clause 21 or Clause 22, wherein the first cross-feed filter path further performs first high-pass filtering having a first cut-off frequency that is based on a resonant frequency of the second speaker, and wherein the second cross-feed filter path further performs second high-pass filtering having a second cut-off frequency that is based on a resonant frequency of the first speaker.

Clause 24. The method of any of Clause 18 to Clause 23, wherein first boost parameters associated with the first boost operation, second boost parameters associated with the second boost operation, and parameters associated with the crosstalk cancellation operation are dynamically controlled based on an amount of available headroom.

Clause 25. The method of any of Clause 18 to Clause 24, wherein each of the first boost operation and the second boost operation corresponds to a frequency-dependent linear filtering operation.

Clause 26. The method of any of Clause 18 to Clause 25, further including: obtaining an audio signal; and performing a left-center-right (LCR) decomposition operation on the audio signal, the LCR decomposition operation including: generating the left audio signal based on left-panned components of the audio signal; generating the right audio signal based on right-panned components of the audio signal; and generating a center audio signal based on center-panned components of the audio signal.

According to Clause 27, a device includes: a memory configured to store instructions; and a processor configured to execute the instructions to perform the method of any of Clause 18 to Clause 26.

According to Clause 28, a non-transitory computer-readable medium includes instructions that, when executed by a processor, cause the processor to perform the method of any of Clause 18 to Clause 26.

According to Clause 29, an apparatus includes means for carrying out the method of any of Clause 18 to Clause 26.

According to Clause 30, a non-transitory computer-readable medium includes instructions that, when executed by one or more processors, cause the one or more processors to: perform a first boost operation on a left audio signal to generate a boosted left audio signal; perform a second boost operation on a right audio signal to generate a boosted right audio signal; perform a crosstalk cancellation operation that includes generation of an adjusted left audio signal based at least in part on the boosted left audio signal and the boosted right audio signal and generation of an adjusted right audio signal based at least in part on the boosted left audio signal and the boosted right audio signal; provide a left output signal for playback at a first speaker, the left output signal based at least in part on the adjusted left audio signal; and provide a right output signal for playback at a second speaker, the right output signal based at least in part on the adjusted right audio signal.

31. The non-transitory computer-readable medium of Clause 30, wherein the instructions, when executed by the one or more processors, further cause the one or more processors to: provide the adjusted left audio signal to a first speaker compensation filter, the first speaker compensation filter configured to perform a first equalization operation on the adjusted left audio signal to adjust a first speaker response of the first speaker; and provide the adjusted right audio signal to a second speaker compensation filter, the second speaker compensation filter configured to perform a second equalization operation on the adjusted right audio signal to adjust a second speaker response of the second speaker.

According to Clause 32, an apparatus includes: means for performing a first boost operation on a left audio signal to generate a boosted left audio signal; means for performing a second boost operation on a right audio signal to generate a boosted right audio signal; means for performing a crosstalk cancellation operation that includes generation of an adjusted left audio signal based at least in part on the boosted left audio signal and the boosted right audio signal and generation of an adjusted right audio signal based at least in part on the boosted left audio signal and the boosted right audio signal, wherein filter parameters associated with the crosstalk cancellation operation are independent of inter-speaker differences between a first speaker and a second speaker; means for providing a left output signal for playback at the first speaker, the left output signal based at least in part on the adjusted left audio signal; and means for providing a right output signal for playback at the second speaker, the right output signal based at least in part on the adjusted right audio signal.

In one or more examples, the functions described may be implemented in hardware, software, firmware, or any combination thereof. If implemented in software, the functions may be stored as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable gate arrays (FPGAs), or other equivalent integrated or discrete logic circuitry. Accordingly, the term "processor," as used herein may refer to any of the foregoing structures or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Those of skill would further appreciate that the various illustrative logical blocks, configurations, circuits, and algorithm steps described in connection with the implementations disclosed herein may be implemented as electronic hardware, computer software executed by a processing device such as a hardware processor, or combinations of both. Various illustrative components, blocks, configurations, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the implementations disclosed herein may be embodied directly in hardware, in a software module executed by a processor, or in a combination of the two. A software module may reside in a memory device, such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary memory device is coupled to the processor such that the processor can read information from, and write information to, the memory device. In the alternative, the memory device may be integral to the processor. The processor and the storage medium may reside in an application-specific integrated circuit (ASIC). The ASIC may reside in a computing device or a user terminal. In the alternative, the processor and the storage medium may reside as discrete components in a computing device or a user terminal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A device comprising:
   a memory configured to store instructions; and
   one or more processors configured to execute the instructions to:
   perform a first boost operation on a left audio signal to generate a boosted left audio signal;
   perform a second boost operation on a right audio signal to generate a boosted right audio signal;
   perform a crosstalk cancellation operation that includes generation of an adjusted left audio signal based at least in part on the boosted left audio signal and the boosted right audio signal and generation of an adjusted right audio signal based at least in part on the boosted left audio signal and the boosted right audio signal;
   provide a left output signal for playback at a first speaker, the left output signal based at least in part on the adjusted left audio signal; and
   provide a right output signal for playback at a second speaker, the right output signal based at least in part on the adjusted right audio signal.

2. The device of claim 1, wherein filter parameters associated with the crosstalk cancellation operation are independent of inter-speaker differences between the first speaker and the second speaker.

3. The device of claim 1, wherein each of the first boost operation and the second boost operation corresponds to a frequency-dependent linear filtering operation.

4. The device of claim 1, wherein the one or more processors are configured to execute the instructions to:
   provide the adjusted left audio signal to a first speaker compensation filter, the first speaker compensation filter configured to perform a first equalization operation on the adjusted left audio signal to adjust a first speaker response of the first speaker; and
   provide the adjusted right audio signal to a second speaker compensation filter, the second speaker compensation filter configured to perform a second equalization operation on the adjusted right audio signal to adjust a second speaker response of the second speaker,
   wherein filter parameters for the first speaker compensation filter and filter parameters for the second speaker compensation filter are based on inter-speaker differences between the first speaker and the second speaker.

5. The device of claim 1, wherein, during performance of the crosstalk cancellation operation, the one or more processors are configured to execute the instructions to:
   provide the boosted left audio signal as an input to a first direct filter and as an input to a first cross-feed filter path that includes a first cross filter;
   provide the boosted right audio signal as an input to a second direct filter and as an input to a second cross-feed filter path that includes a second cross filter;
   generate the adjusted left audio signal based at least in part on an output of the first direct filter and an output of the second cross filter; and
   generate the adjusted right audio signal based at least in part on an output of the second direct filter and an output of the first cross filter.

6. The device of claim 5, wherein the one or more processors are configured to execute the instructions to:
   apply a first gain to the output of the first cross filter to generate a first gain-adjusted output of the first cross-feed filter path, wherein the adjusted right audio signal is generated based on the output of the second direct filter and the first gain-adjusted output; and
   apply a second gain to the output of the second cross filter to generate a second gain-adjusted output of the second cross-feed filter path, wherein the adjusted left audio signal is generated based on the output of the first direct filter and the second gain-adjusted output.

7. The device of claim 5, wherein the first cross-feed filter path further comprises at least a first high-pass filter having a first cut-off frequency that is based on a resonant frequency of the second speaker, and wherein the second cross-feed filter path further comprises at least a second high-pass filter having a second cut-off frequency that is based on a resonant frequency of the first speaker.

8. The device of claim 5, wherein filter parameters associated with the crosstalk cancellation operation comprise:
   first filter coefficients associated with the first direct filter;
   second filter coefficients associated with the second direct filter, wherein the first filter coefficients match the second filter coefficients;
   third filter coefficients associated with the first cross filter; and
   fourth filter coefficients associated with the second cross filter, wherein the third filter coefficients match the fourth filter coefficients.

9. The device of claim 5, wherein the first direct filter and the second direct filter comprise delay filters.

10. The device of claim 1, wherein the one or more processors are configured to execute the instructions to:
    obtain an audio signal; and
    perform a left-center-right (LCR) decomposition operation on the audio signal to:
    generate the left audio signal based on left-panned components of the audio signal;
    generate the right audio signal based on right-panned components of the audio signal; and
    generate a center audio signal based on center-panned components of the audio signal.

11. The device of claim 10, wherein the adjusted left audio signal and the adjusted right audio signal are generated at least in part based on the center audio signal.

12. The device of claim 1, further comprising a modem coupled to the one or more processors, the modem configured to receive the left audio signal and the right audio signal from a second device.

13. The device of claim 1, wherein the one or more processors are integrated in at least one of a mobile phone, a tablet computer device, a wearable electronic device, or a camera device, a virtual reality headset, a mixed reality headset, or an augmented reality headset.

14. The device of claim 1, wherein the one or more processors are integrated in a vehicle, the vehicle further including:
the first speaker configured to generate first sound during playback, the first sound generated based on the left output signal; and
the second speaker configured to generate second sound during playback, the second sound generated based on the right output signal.

15. A method comprising:
performing, at one or more processors, a first boost operation on a left audio signal to generate a boosted left audio signal;
performing, at the one or more processors, a second boost operation on a right audio signal to generate a boosted right audio signal;
performing, at the one or more processors, a crosstalk cancellation operation, the crosstalk cancellation operation comprising:
generating an adjusted left audio signal based at least in part on the boosted left audio signal and the boosted right audio signal; and
generating an adjusted right audio signal based at least in part on the boosted left audio signal and the boosted right audio signal;
providing a left output signal to a first speaker for playback, the left output signal based at least in part on the adjusted left audio signal; and
providing a right output signal to a second speaker for playback, the right output signal based at least in part on the adjusted right audio signal.

16. The method of claim 15, further comprising:
providing the adjusted left audio signal to a first speaker compensation filter, the first speaker compensation filter configured to perform a first equalization operation on the adjusted left audio signal to adjust a first speaker response of the first speaker; and
providing the adjusted right audio signal to a second speaker compensation filter, the second speaker compensation filter configured to perform a second equalization operation on the adjusted right audio signal to adjust a second speaker response of the second speaker.

17. The method of claim 16, wherein filter parameters for the first speaker compensation filter and the second speaker compensation filter are based on inter-speaker differences between the first speaker and the second speaker, and wherein filter parameters associated with the crosstalk cancellation operation are independent of the inter-speaker differences between the first speaker and the second speaker.

18. The method of claim 15, wherein first boost parameters associated with the first boost operation, second boost parameters associated with the second boost operation, and parameters associated with the crosstalk cancellation operation are dynamically controlled based on an amount of available headroom.

19. A non-transitory computer-readable medium comprising instructions that, when executed by one or more processors, cause the one or more processors to:
perform a first boost operation on a left audio signal to generate a boosted left audio signal;
perform a second boost operation on a right audio signal to generate a boosted right audio signal;
perform a crosstalk cancellation operation that includes generation of an adjusted left audio signal based at least in part on the boosted left audio signal and the boosted right audio signal and generation of an adjusted right audio signal based at least in part on the boosted left audio signal and the boosted right audio signal;
provide a left output signal for playback at a first speaker, the left output signal based at least in part on the adjusted left audio signal; and
provide a right output signal for playback at a second speaker, the right output signal based at least in part on the adjusted right audio signal.

20. The non-transitory computer-readable medium of claim 19, wherein the instructions, when executed by the one or more processors, further cause the one or more processors to:
provide the adjusted left audio signal to a first speaker compensation filter, the first speaker compensation filter configured to perform a first equalization operation on the adjusted left audio signal to adjust a first speaker response of the first speaker; and
provide the adjusted right audio signal to a second speaker compensation filter, the second speaker compensation filter configured to perform a second equalization operation on the adjusted right audio signal to adjust a second speaker response of the second speaker.

* * * * *